(12) United States Patent
Oyu

(10) Patent No.: US 7,902,573 B2
(45) Date of Patent: Mar. 8, 2011

(54) SEMICONDUCTOR DEVICE INCLUDING VERTICAL MOS TRANSISTORS

(75) Inventor: Kiyonori Oyu, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 368 days.

(21) Appl. No.: 12/239,048

(22) Filed: Sep. 26, 2008

(65) Prior Publication Data

US 2009/0085098 A1 Apr. 2, 2009

(30) Foreign Application Priority Data

Sep. 27, 2007 (JP) ................. 2007-251130

(51) Int. Cl.
*H01L 23/52* (2006.01)
(52) U.S. Cl. .......... 257/207; 257/E29.262; 257/E21.659; 438/268
(58) Field of Classification Search ............ 257/E29.262
See application file for complete search history.

(56) References Cited

U.S. PATENT DOCUMENTS

2004/0262681 A1 12/2004 Masuoka et al.

FOREIGN PATENT DOCUMENTS

JP 2002-094027 A 3/2002

*Primary Examiner* — N Drew Richards
*Assistant Examiner* — Peter Bradford
(74) *Attorney, Agent, or Firm* — Sughrue Mion, PLLC

(57) ABSTRACT

A semiconductor device includes: a plurality of vertical MOS transistors sharing a gate electrode (2) of a first conductivity type; first semiconductor pillars (3, 4 and 5) with a gate insulating film (18) formed therearound, across the gate insulating film (18) the vertical MOS transistors facing the gate electrode; and a second semiconductor pillar (8) being of the first conductivity type which is the same as the conductivity type of the gate electrode and being in contact with the gate electrode at a portion thereof from which at least a part of the gate insulating film is removed, wherein potential supply (6) to the shared gate electrode (2) is effected through the second semiconductor pillar (8).

8 Claims, 27 Drawing Sheets

SEMICONDUCTOR DEVICE INCLUDING VERTICAL MOS TRANSISTORS

BACKGROUND OF THE INVENTION

1. Field of the Invention

The present invention relates to power supply to a gate electrode of a vertical MOS transistor and, more particularly, to a semiconductor device having a structure suitable for power supply to a gate electrode shared between a plurality of vertical MOS transistors.

2. Description of Related Art

A conventional three-dimensional transistor, i.e., a vertical MOS transistor, has a structure wherein: in an Si pillar forming source/drain diffusion layers and a channel, the channel portion is surrounded by a gate insulating film and a gate electrode, while the source/drain diffusion layers are formed at top and bottom of the silicon pillar to sandwich the channel portion completely, as shown in FIG. 2 of United States Patent US2004/26281A1 (Document 1).

Japanese Patent Laid-Open No. 2002-94027 (Document 2) discloses a semiconductor memory device having a plurality of silicon pillars defined by a lattice-shaped trench formed in a surface of a silicon substrate, wherein: a select transistor is formed on a side surface of each silicon pillar with its source or drain diffusion layer formed in the bottom of the trench, the select transistor forming a select transistor of a one-transistor one-capacitor type DRAM cell; and the trench bottom diffusion layer is connected to a fixed voltage common to a multiplicity of memory cells. This document also discloses the technique of continuously interconnecting gate electrodes each formed so as to come into contact with one side surface of a respective one of the silicon pillars across an intervening gate insulating film, to form a word line.

Document 1 does not make any explicit mention of a structure for potential supply to the gate electrode of the vertical MOS transistor. Nor does Document 1 disclose a structure for power supply to a gate electrode shared between a plurality of vertical MOS transistors.

Normally, it is supposed that the potential supply is effected through a contact formed at any point on the gate electrode material. However, it is not easy to form the contact directly on the gate electrode material in an array section densely formed with minute vertical MOS transistors. Even if the formation of the contact is possible, there arises another problem that the contact position is limited and, hence, the design freedom is limited.

The semiconductor device disclosed in Document 2 involves a problem that since the channel is formed in only one side surface of each silicon pillar, the semiconductor device is inferior in subthreshold properties to the vertical MOS transistor described in Document 1 in which the periphery of the channel is covered with the gate electrode so as to be completely depleted.

Accordingly, a demand exists for a semiconductor device including means having a high degree of design freedom for potential supply to a gate electrode in an array section densely formed with vertical MOS transistors.

SUMMARY

The present invention seeks to solve one or more of the above problems, or to improve upon those problems at least in part.

In one embodiment, there is provided a semiconductor device that includes:

a plurality of vertical MOS transistors sharing a gate electrode of a first conductivity type, wherein the plurality of vertical MOS transistors comprises first semiconductor pillars with a first gate insulating film formed therearound, and facing said gate electrode via said first gate insulating film; and a second semiconductor pillar being of the first conductivity type with a second gate insulating film formed therearound, and being in contact with the gate electrode at a portion thereof from which at least a part of the second gate insulating film is removed, wherein potential supply to the gate electrode shared between the plurality of vertical MOS transistors is effected through the second semiconductor pillar.

According to this embodiment, when an array section is formed which comprises a plurality of vertical MOS transistors sharing a gate electrode, the potential supply to the gate electrode shared between the vertical MOS transistors can be effected through the second semiconductor pillar. In this structure, the second semiconductor pillar can be disposed freely on the periphery of the array section, thus resulting in increased design freedom.

BRIEF DESCRIPTION OF THE DRAWINGS

The above features and advantages of the present invention will be more apparent from the following description of certain embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

FIRST EXEMPLARY EXAMPLE

Figure 1:
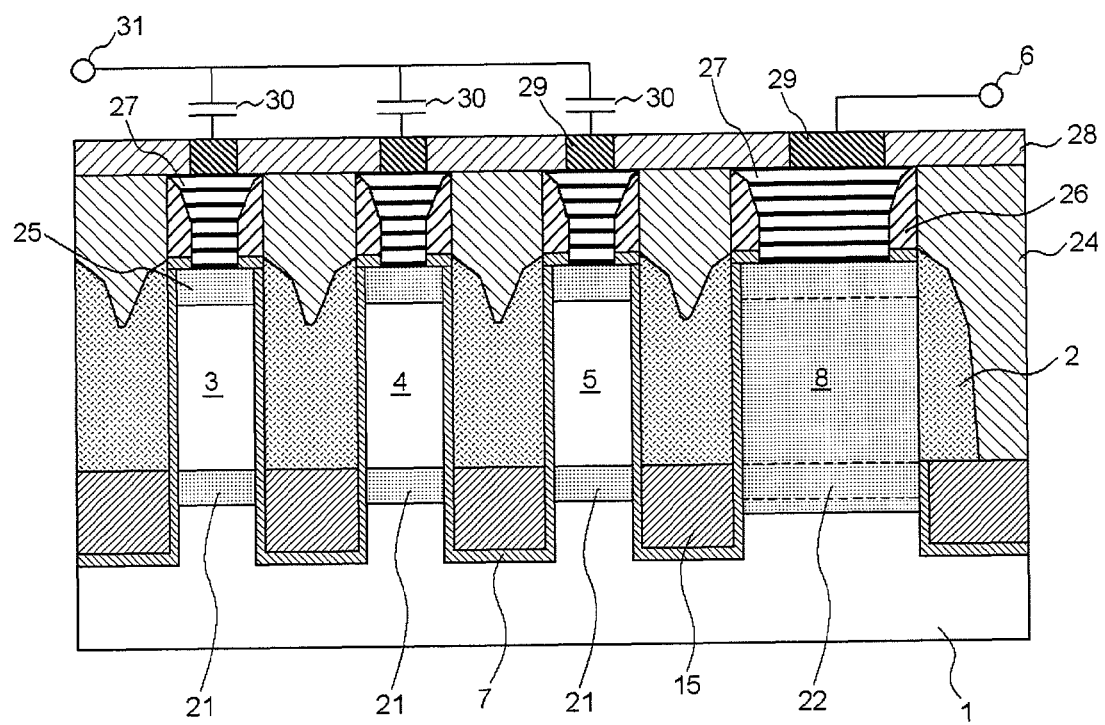
FIG. 1 is a longitudinal section view illustrating a first Example.

As shown in FIG. 1, a semiconductor device according to a first Example has a structure including: a plurality of first prismatic pillars 3, 4 and 5 for vertical MOS transistors which share gate electrode 2 of a first conductivity type formed on a major surface of silicon substrate 1; and second pillar 8 formed simultaneously with first prismatic pillars 3, 4 and 5 forming the respective prismatic vertical MOS transistors, second pillar 8 being partially free of gate insulating film 7 and being of the first conductivity type which is the same as the conductivity type of gate electrode 2, wherein potential supply to gate electrode 2 is effected through a path extending from potential supply section 6, passing through electrodes 27 and 29 contacted with the top of second pillar 8, and reaching gate electrode 2 in contact with diffusion layer 22 of second pillar 8 at which gate insulating film 7 is not formed.
Fabrication Method for First Example A fabrication method for the first Example is as follows.

Figure 2A:
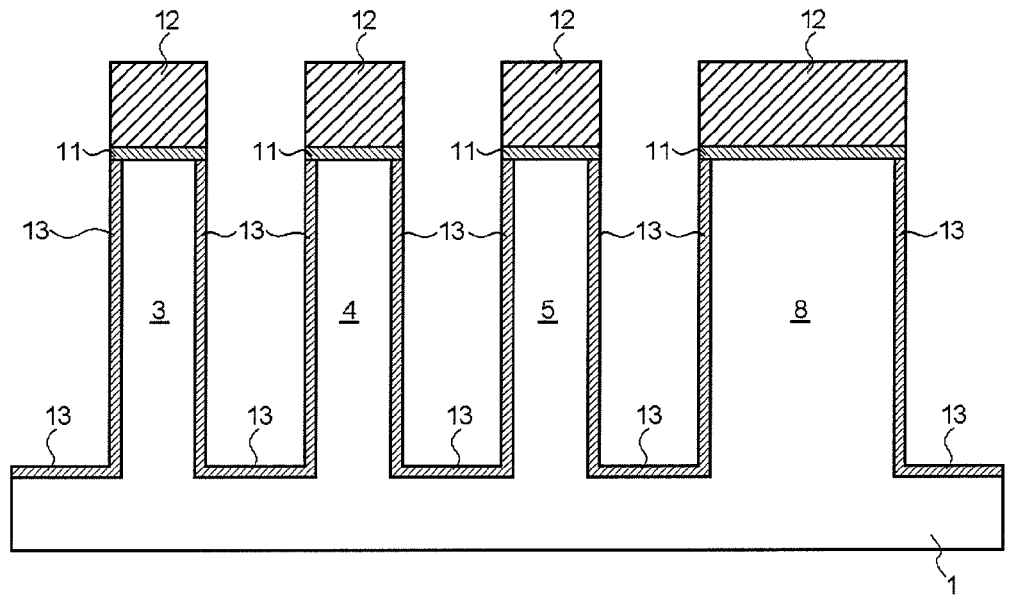
FIGS. 2A, 3A, 4A and 5A are longitudinal section views illustrating process steps in a fabrication method for the first Example.

As shown in the sectional view in FIG. 2A, silicon substrate 1 was doped with boron to a depth of 500 nm from its surface so as to have a boron concentration of $3e17/cm^3$, and thereafter, an etching mask comprising 5 nm-thick silicon oxide film 11 and 100 nm-thick silicon nitride film 12 was formed on the surface of silicon substrate 1. Silicon substrate 1 was then subjected to dry etching to form silicon pillars 3, 4, 5 and 8. The height of the pillars was set to 150 nm. Here, silicon pillars 3, 4 and 5 were shaped like lines, while silicon pillar 8 was shaped rectangular, as shown in the plan view in FIG. 2B. Thereafter, the exposed silicon surface was thermally oxidized to form 5 nm-thick silicon oxide films 13.

Figure 3A:
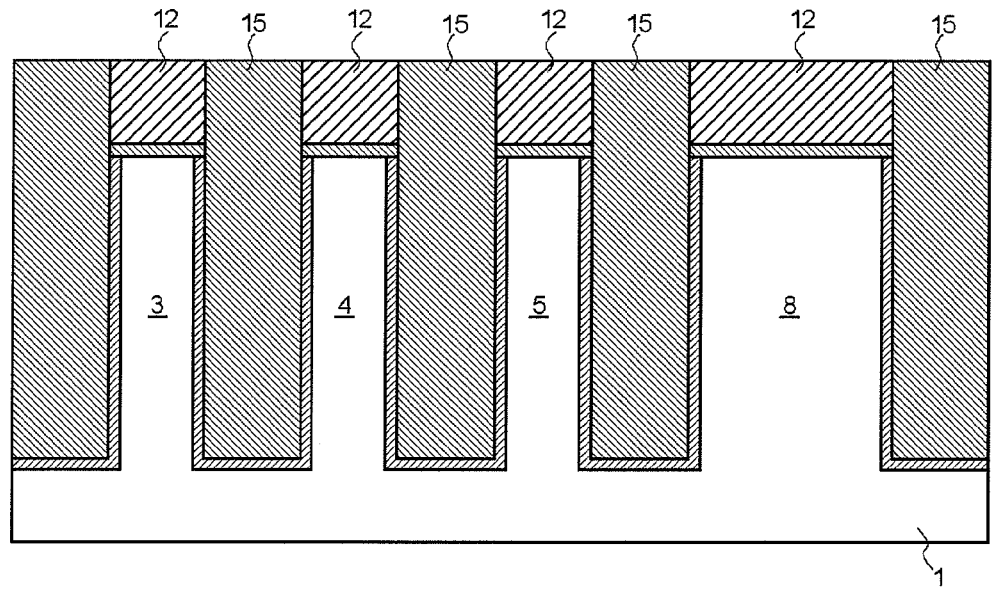
Figure 3B:
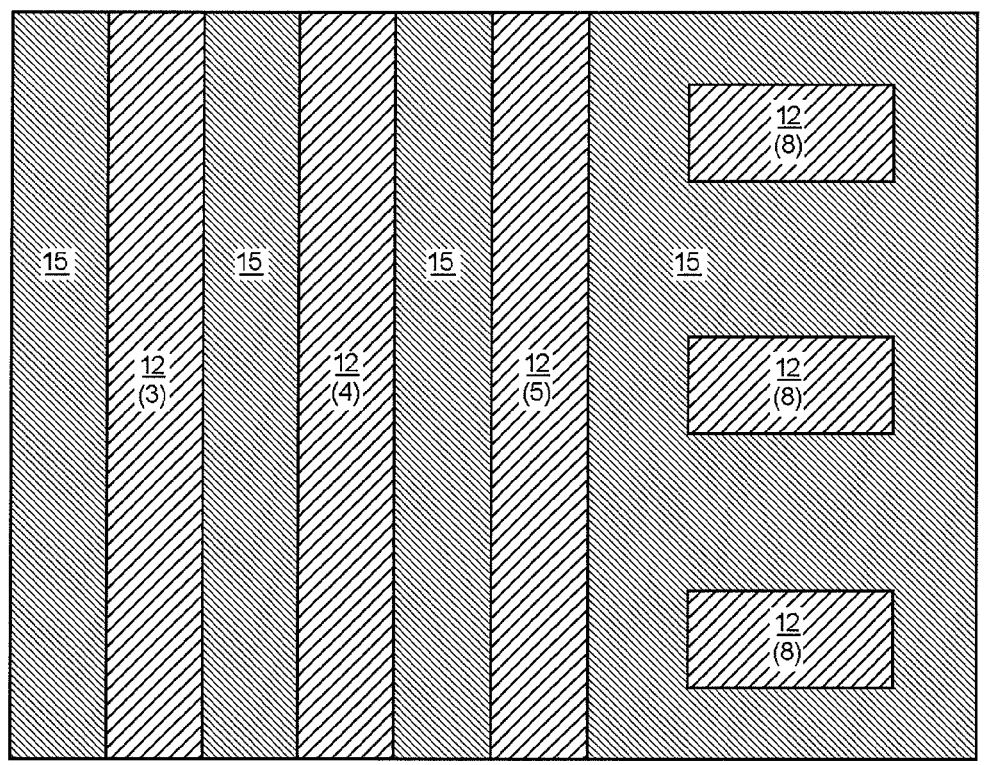

Subsequently, as shown in the longitudinal section view and top view in respective of FIGS. 3A and 3B, silicon oxide film 15 was deposited and then planarized by CMP method, so that the space around each of silicon pillars 3, 4, 5 and 8 was filled up with silicon oxide film 15.

Figure 4A:
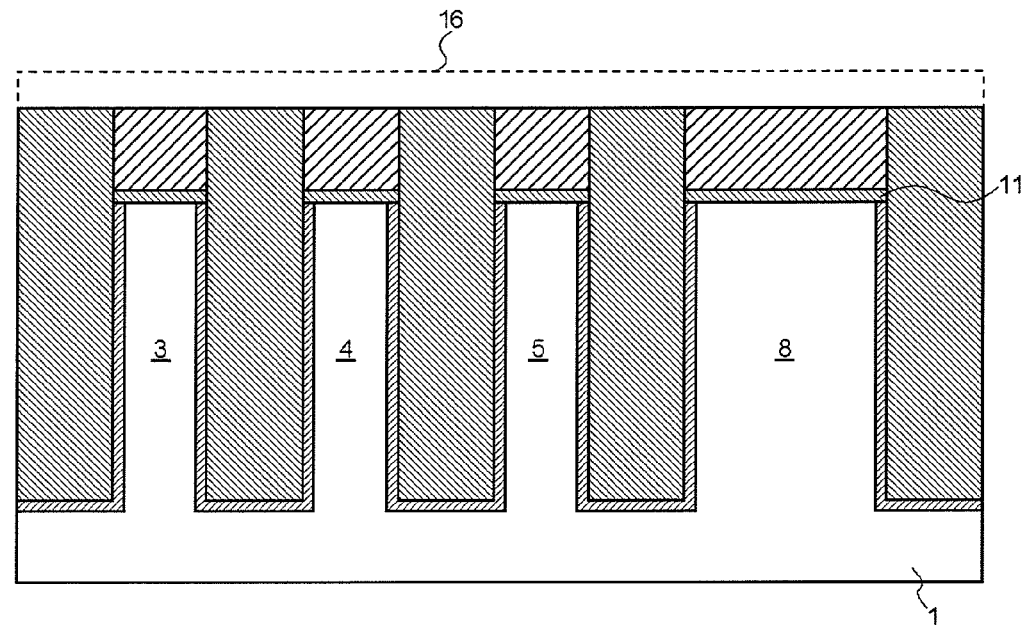
Figure 4B:
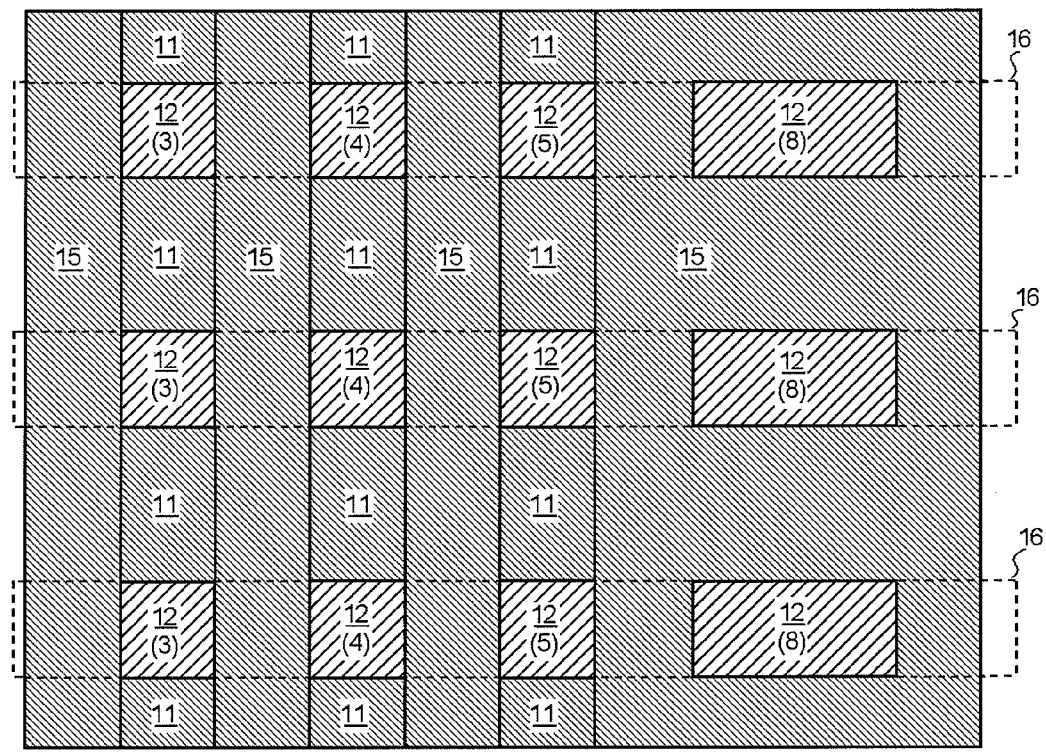

Subsequently, as shown in the longitudinal section view in FIG. 4A, resist mask 16 was formed, and then silicon nitride film 12 was worked so that silicon nitride film 12 remained in a plane as shown in FIG. 4B. In the regions from which silicon nitride film 12 was removed, silicon oxide films 11 on silicon pillars 3, 4 and 5 were exposed.

Subsequently, as shown in the longitudinal section view and top view in respective of FIGS. 5A and 5B, silicon oxide film 15 was retreated by etching. Here, the amount of etching was 100 nm, and remaining silicon oxide 15 was 50 nm thick. At the same time therewith, silicon oxide films 11 and 13 on sidewall portions of silicon pillars 3, 4 and 5 that were free of silicon nitride film 12 were etched, so that silicon pillars 3, 4 and 5 were exposed.

Subsequently, as shown in the top view in FIG. 6C, silicon pillars 3, 4 and 5 exposed in the regions free of silicon nitride film 12 were etched using silicon nitride film 12 as a mask. Here, the amount of silicon etched was 100 nm. FIG. 6A is a longitudinal section view taken on line A-A of FIG. 6C. Though FIG. 6A is the same as the longitudinal section view in FIG. 5A, the silicon pillars came to have substantially the same height as silicon oxide film 15 in the longitudinal section view (FIG. 6B) taken on line B-B of FIG. 6C, so that silicon surfaces 17 were exposed.

Figure 7A:
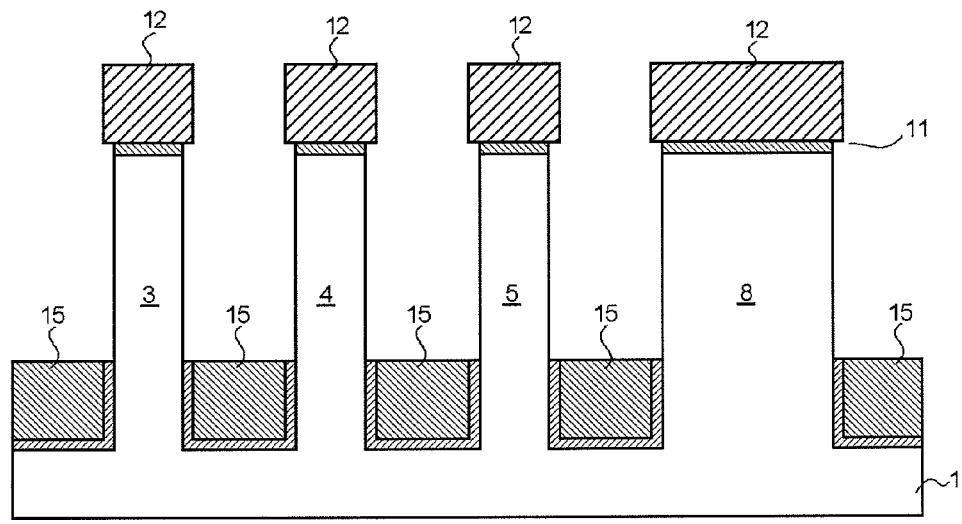
FIGS. 7A and 7B are longitudinal section views taken on line A-A and line B-B, respectively, of FIG. 7C.
Figure 7B:
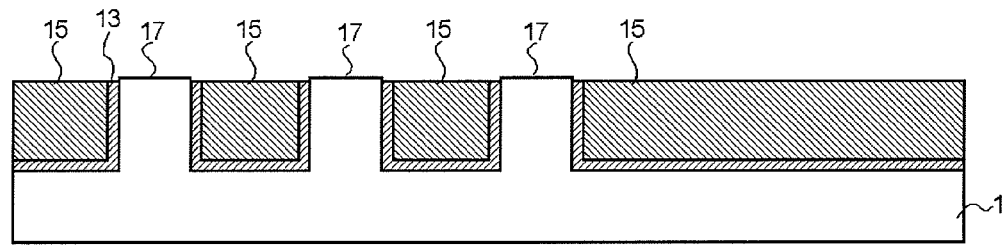
Figure 7C:
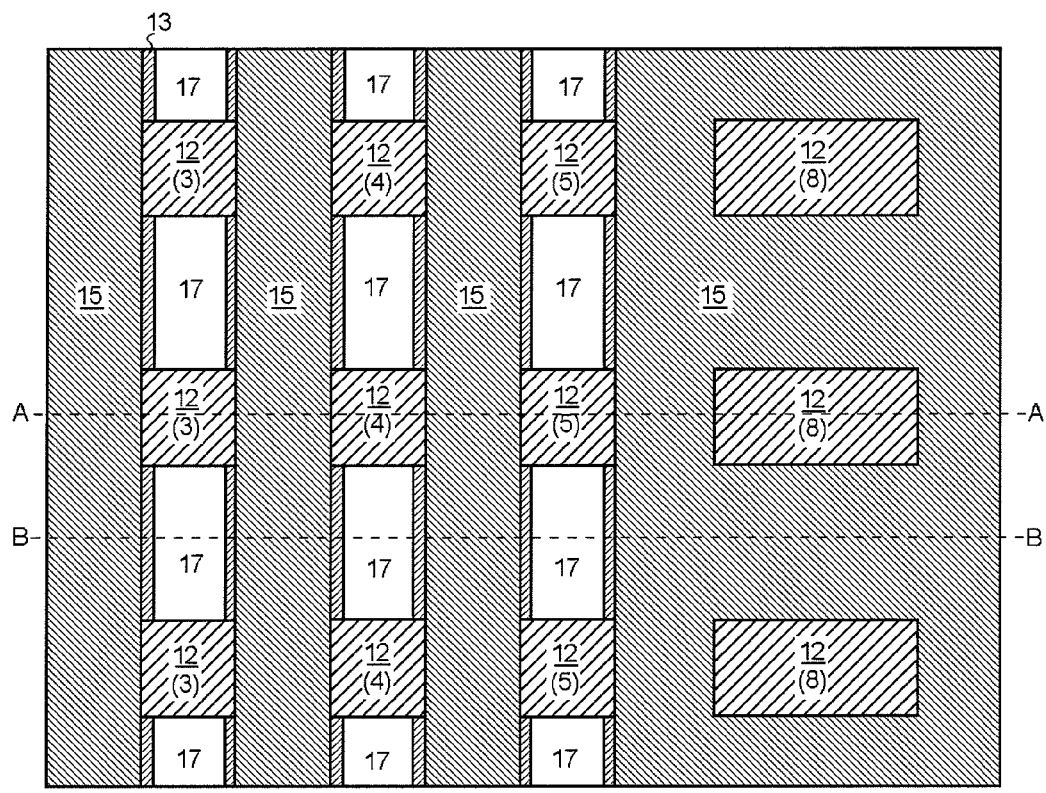
FIG. 7C is a top view illustrating a subsequent process step in the fabrication method for the first Example.

Subsequently, as shown in the longitudinal section view in FIG. 7A, silicon oxide film 13 was etched to expose silicon of silicon pillars 3, 4, 5 and 8 at their side surfaces. As shown in the longitudinal section view (FIG. 7B) taken on line B-B of FIG. 7C, the surfaces of silicon oxide films 13 and 15 became slightly lower than silicon surfaces 17.

Figure 8A:
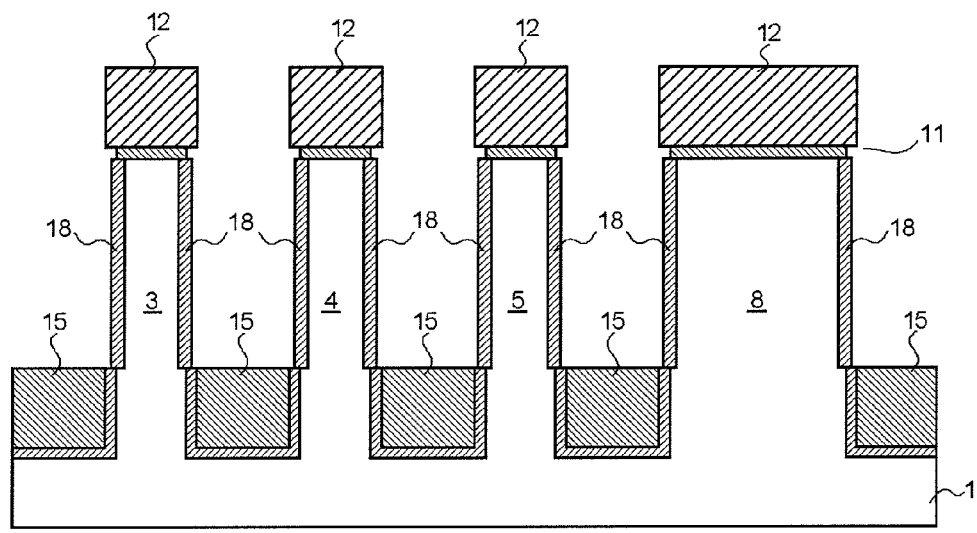
FIGS. 8A and 8B are longitudinal section views taken on line A-A and line B-B, respectively, of FIG. 8C.
Figure 8B:
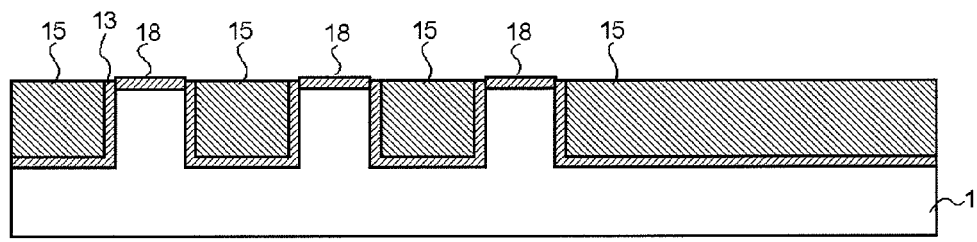
Figure 8C:
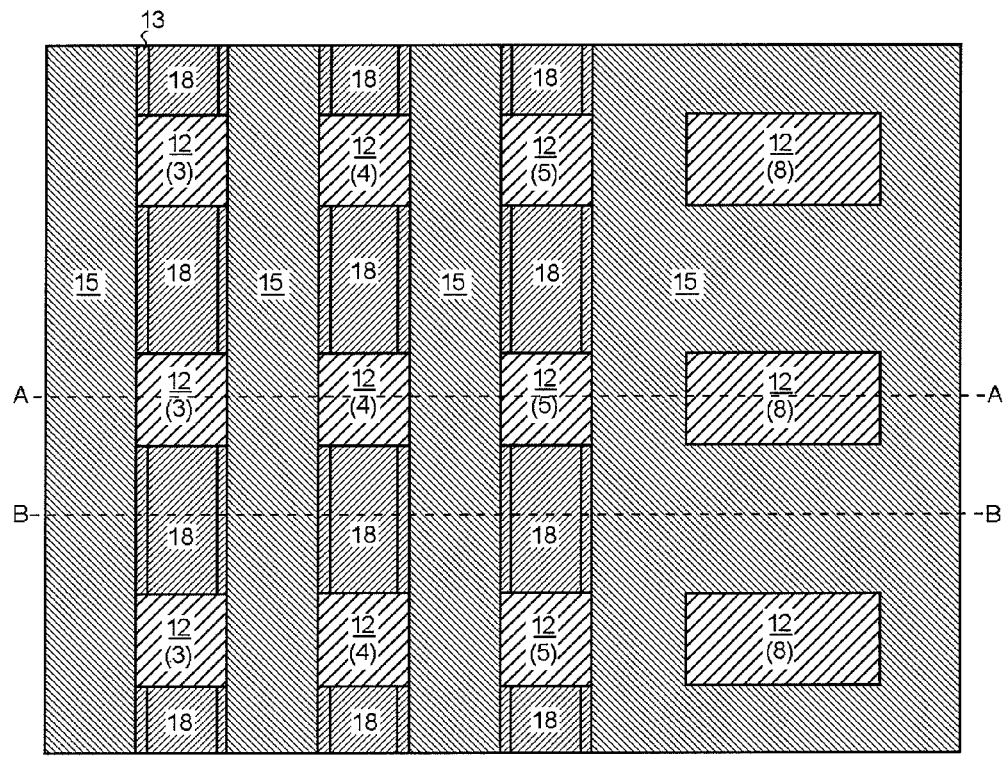
FIG. 8C is a top view illustrating a subsequent process step in the fabrication method for the first Example.

Subsequently, as shown in FIG. 8, 7 nm-thick gate oxide film 18 was formed on side surfaces of silicon pillars 3, 4, 5 and 8 (see FIG. 8A) and on silicon surfaces 17 (see FIG. 8B) by thermal oxidation.

Figure 9A:
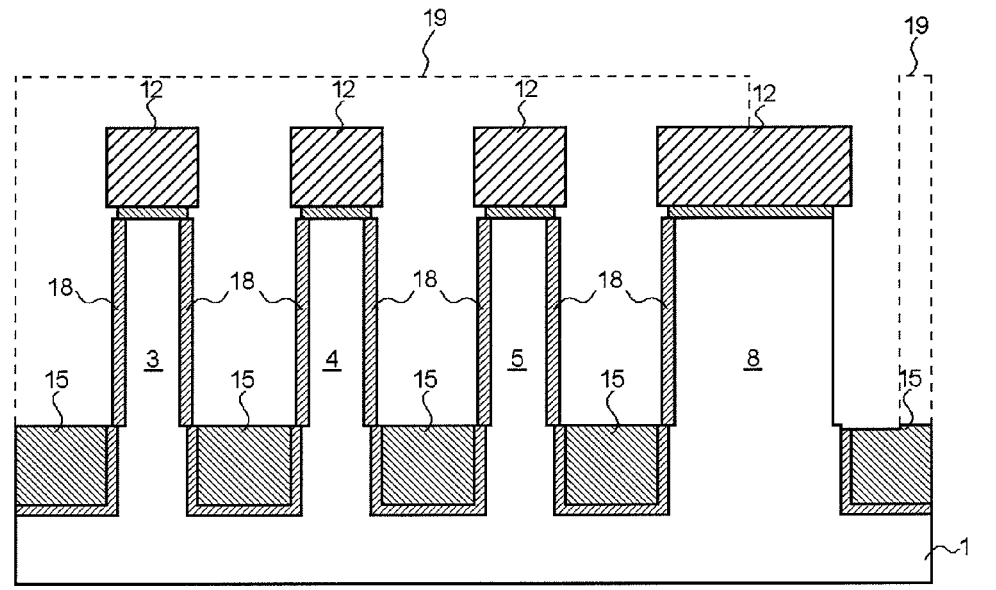
FIG. 9A is a longitudinal section view taken on line A-A of FIG. 9B.
Figure 9B:
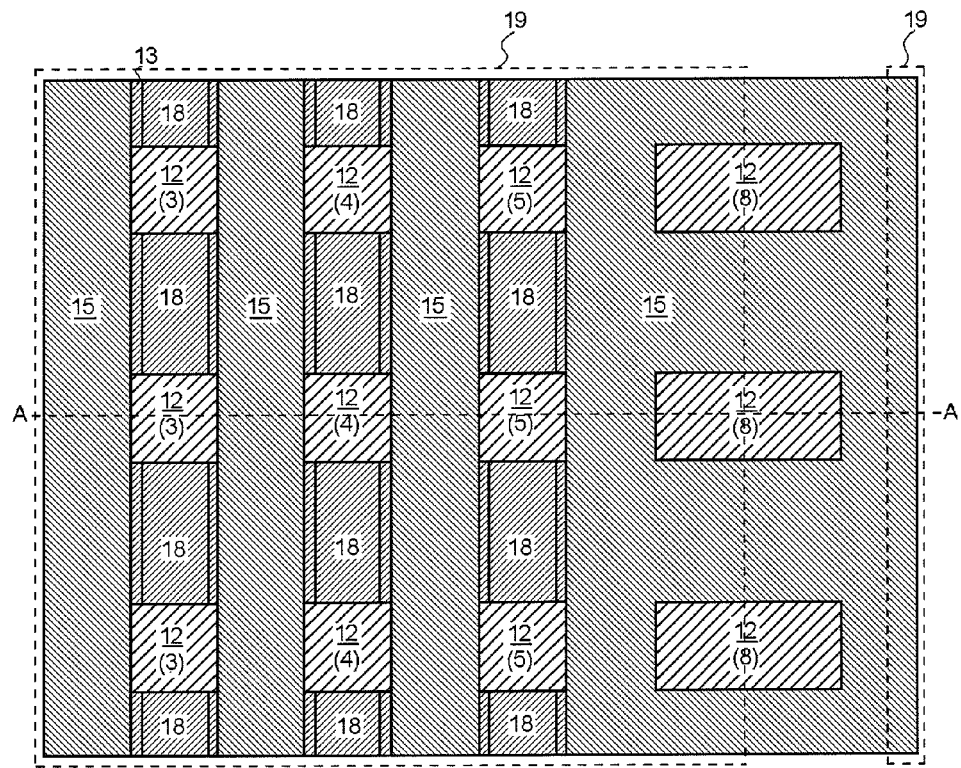
FIG. 9B is a top view illustrating a subsequent process step in the fabrication method for the first Example.

Subsequently, as shown in the top view in FIG. 9B, resist mask 19 was opened. The resulting longitudinal section view taken on line A-A was as shown in FIG. 9A. In this state, gate oxide film 18 was etched to expose silicon in a portion of silicon pillar 8.

Figure 10A:
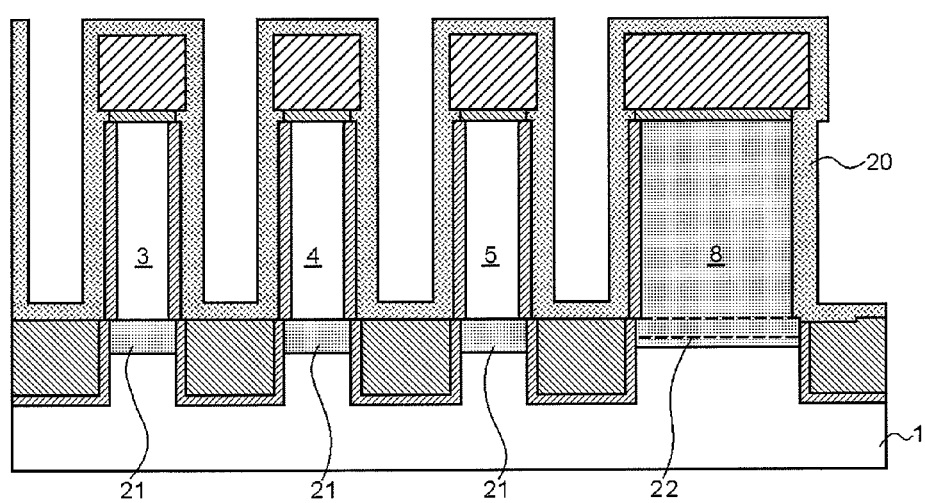
FIGS. 10A and 10B are longitudinal section views taken on line A-A and line C-C, respectively, of FIG. 10C.
Figure 10B:
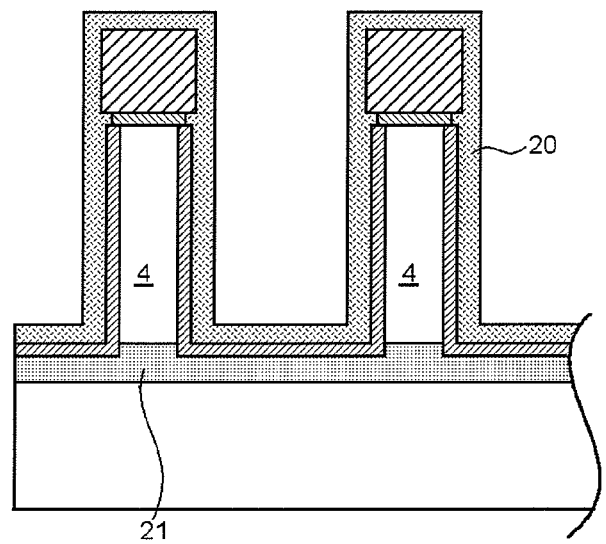
Figure 10C:
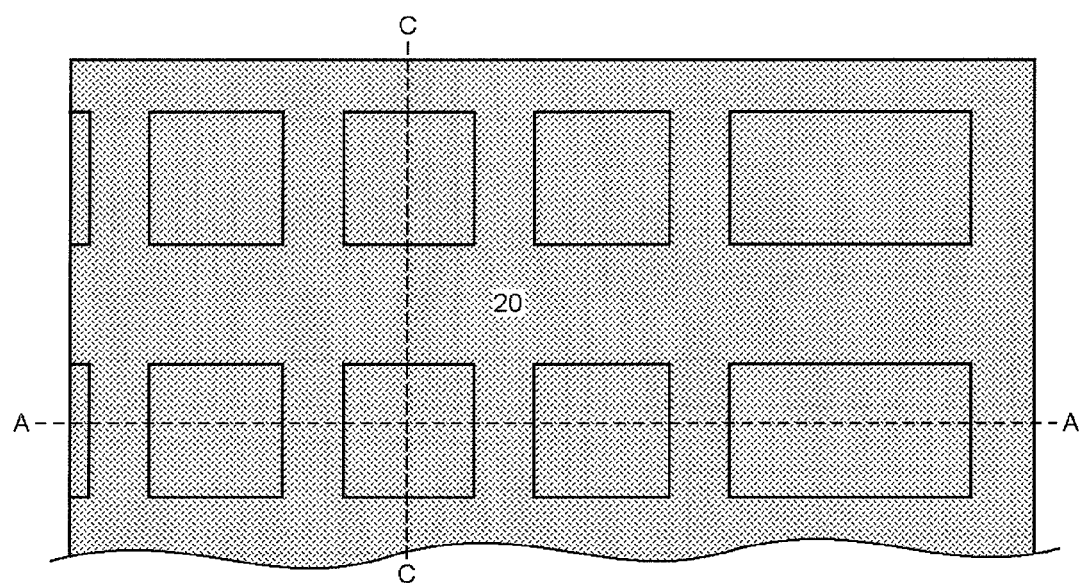
FIG. 10C is a fragmentary top view illustrating a subsequent process step in the fabrication method for the first Example.

Subsequently, as shown in the longitudinal section view in FIG. 10A, a polycrystalline silicon film doped with phosphorus in an amount of $4e20/cm^3$ was deposited to a thickness of 10 nm. Then, arsenic in an amount of only $1e14/cm^2$ was implanted at 50 keV, followed by a heat treatment at 1,000° C. for 10 seconds, to dope silicon surfaces 17 except the silicon pillars, as shown in the top view in FIG. 10C. At that time, arsenic was diffused laterally from silicon surfaces 17 to form n-type lower diffusion layer 21, as shown in the longitudinal section view in FIG. 10B. The heat treatment mentioned above caused phosphorus contained in the polycrystalline silicon film by doping to diffuse into silicon pillar 8, thus turning silicon pillar 8 into n-type layer 22. Note that FIGS. 10A and 10B are longitudinal section views taken on line A-A and line C-C, respectively, of FIG. 10C.

Figure 11A:
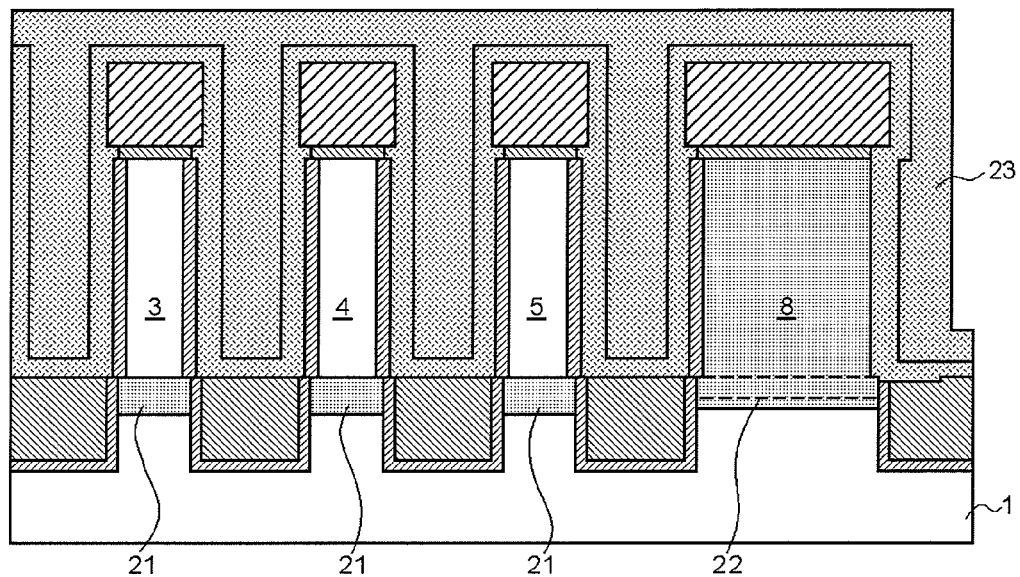
FIGS. 11A and 11B are longitudinal section views taken on line A-A and line C-C, respectively, of FIG. 11C.
Figure 11B:
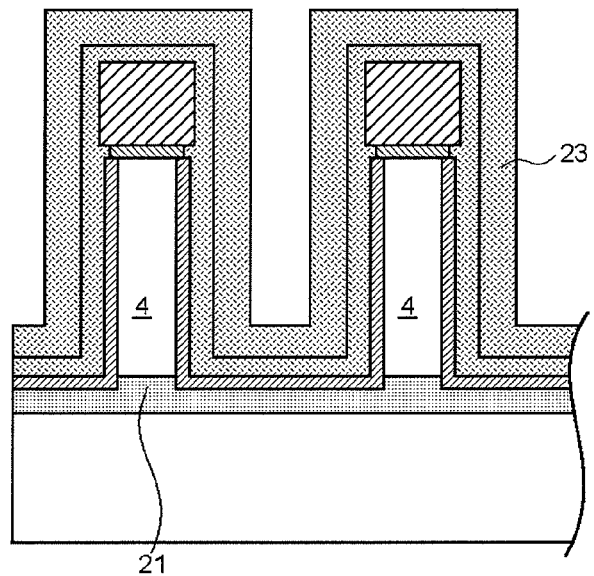
Figure 11C:
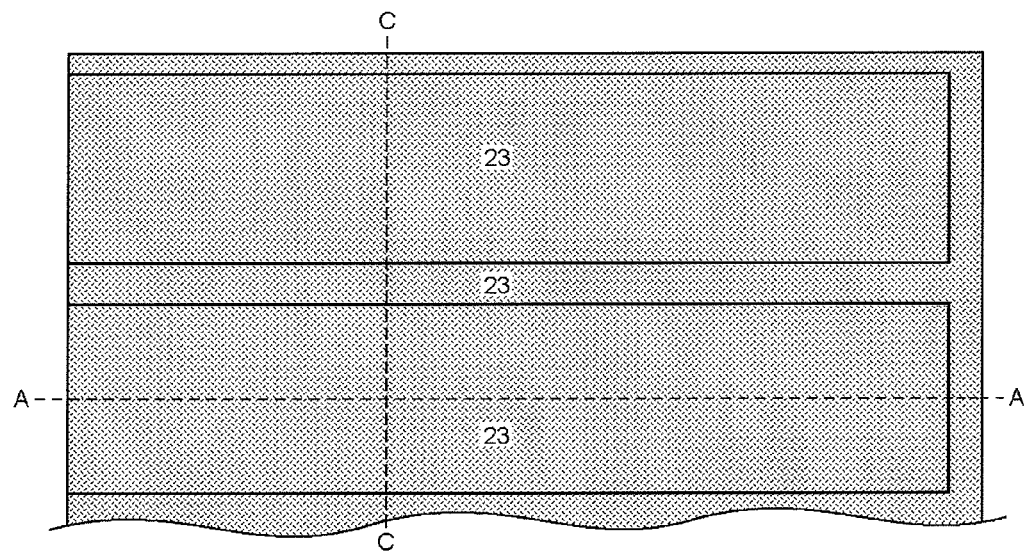
FIG. 11C is a fragmentary top view illustrating a subsequent process step in the fabrication method for the first Example.

Subsequently, as shown in the longitudinal section views in FIGS. 11A and 11B and in the top view in FIG. 11C, polycrystalline silicon film 23 doped with phosphorus in an amount of $4e20/cm^3$ was deposited to a thickness of 20 nm. As a result, the space between adjacent ones of silicon pillars 3, 4, 5 and 8 was filled up with polycrystalline silicon films 20 and 23.

Figure 12A:
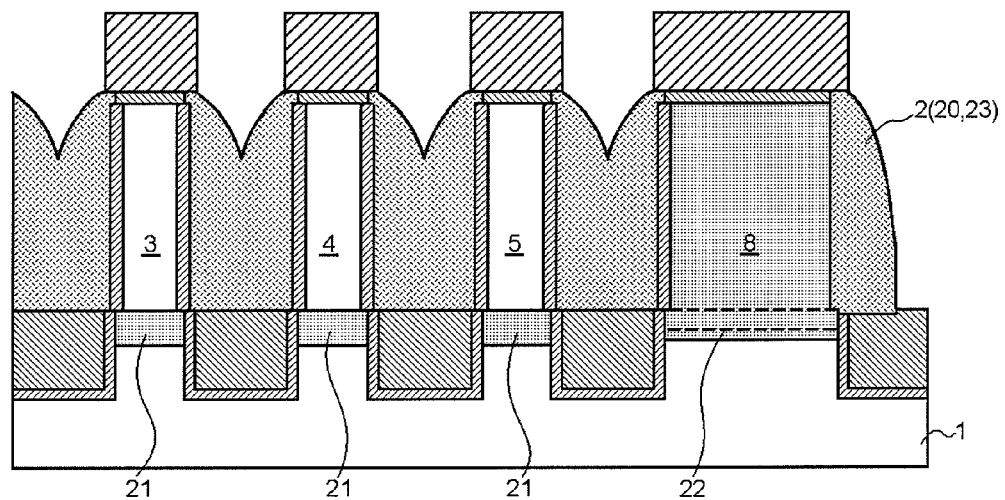
FIGS. 12A and 12B are longitudinal section views taken on line A-A and line C-C, respectively, of FIG. 12C.

Subsequently, as shown in the longitudinal section view in FIG. 12A, polycrystalline silicon films 20 and 23 were etched back by 15 nm. As a result, the sidewall portion of each of silicon pillars 3, 4, 5 and 8 was covered with gate electrode 2 (i.e., polycrystalline silicon films 20 and 23) as shown in the top view in FIG. 12C, thus forming a structure in which gate electrodes 2 (i.e., polycrystalline silicon films 20 and 23) formed around respective silicon pillars 3, 4, 5 and 8 are electrically interconnected in the lateral direction in the figure.

Figure 12B:
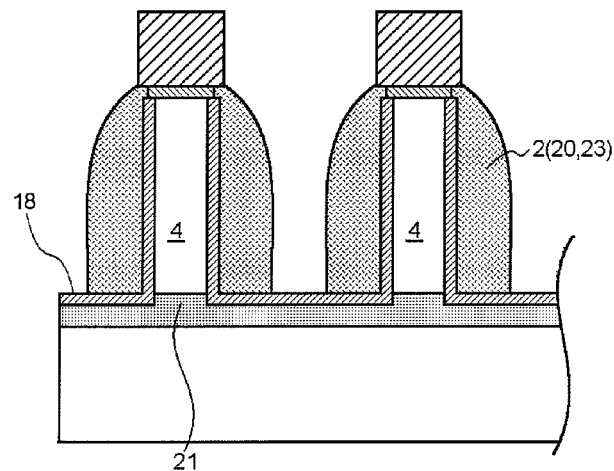
Figure 12C:
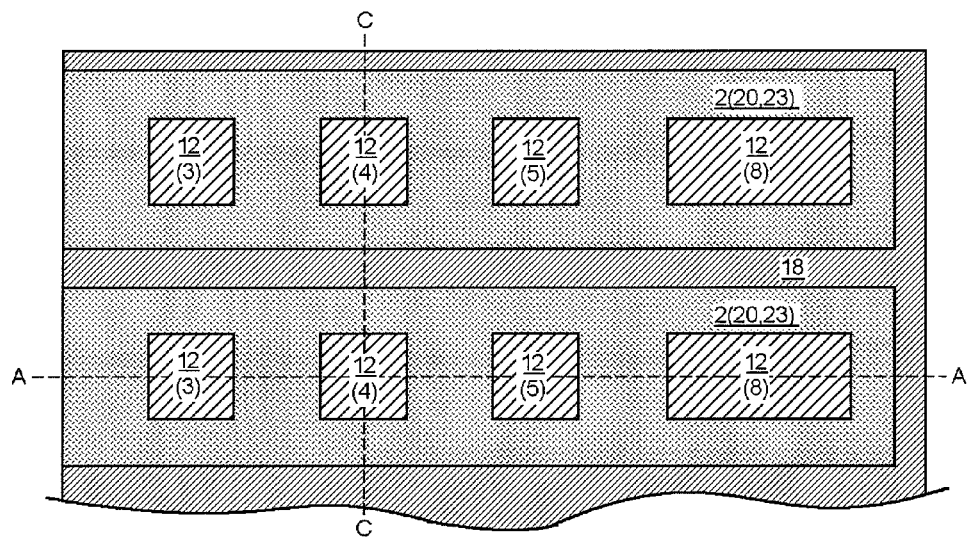
FIG. 12C is a fragmentary top view illustrating a subsequent process step in the fabrication method for the first Example.

In the C-C section, the silicon pillars were spaced apart from each other and, hence, gate electrodes 2 (i.e., polycrystalline silicon films 20 and 23) on the respective silicon pillars were isolated from each other as shown in FIG. 12B.

Figure 13A:
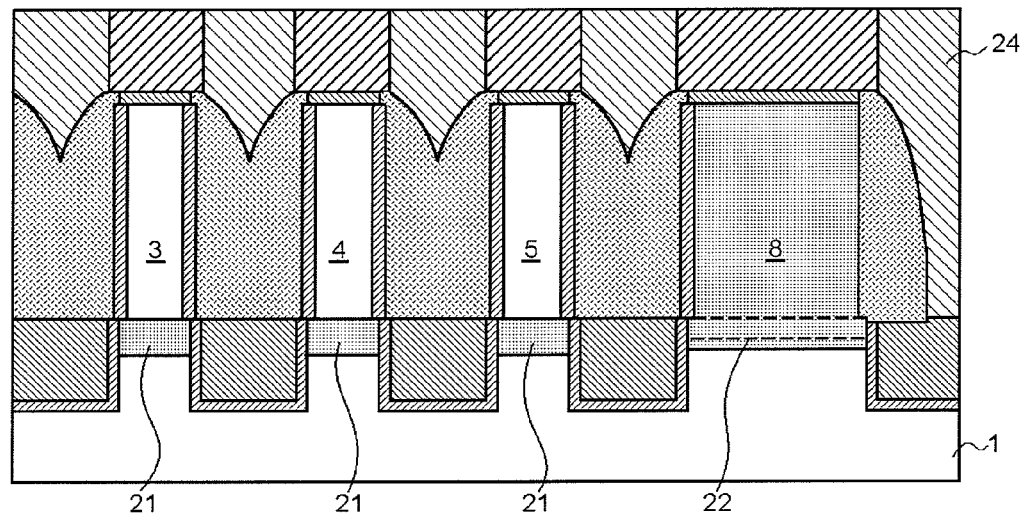
FIGS. 13A and 13B are longitudinal section views taken on line A-A and line C-C, respectively, of FIG. 13C.
Figure 13B:
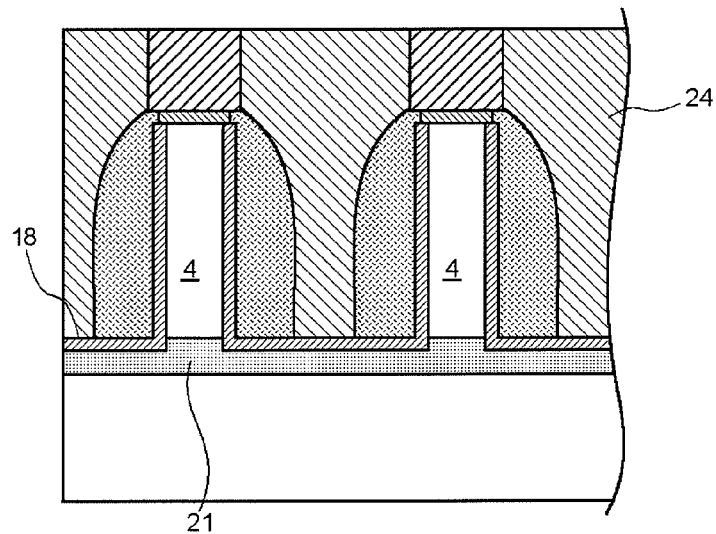
Figure 13C:
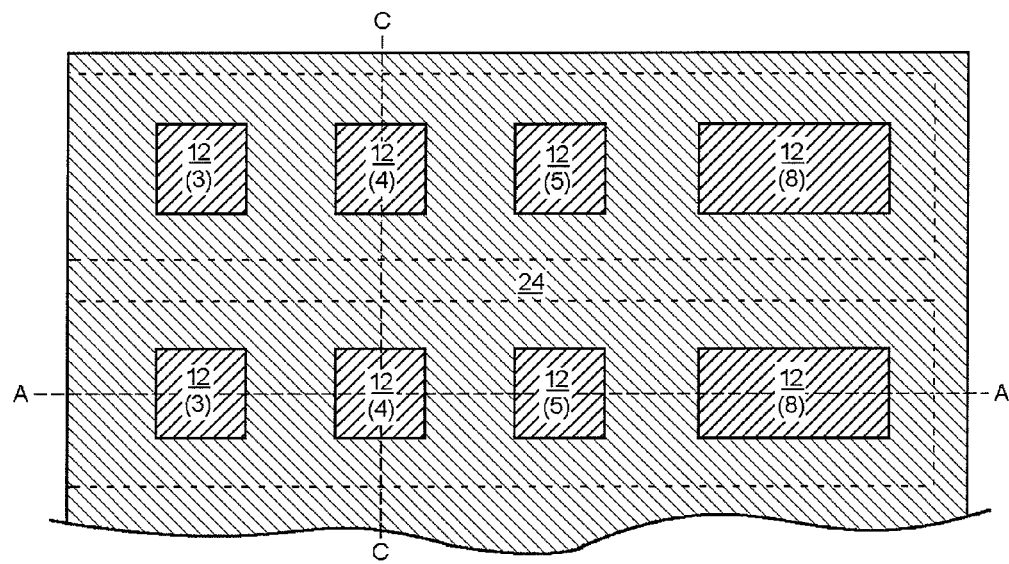
FIG. 13C is a fragmentary top view illustrating a subsequent process step in the fabrication method for the first Example.

Subsequently, as shown in the longitudinal section views in FIGS. 13A and 13B, silicon oxide film 24 was deposited and then planarized by CMP. FIGS. 13A and 13B are longitudinal section views taken on line A-A and line C-C, respectively, of FIG. 13C.

Figure 14A:
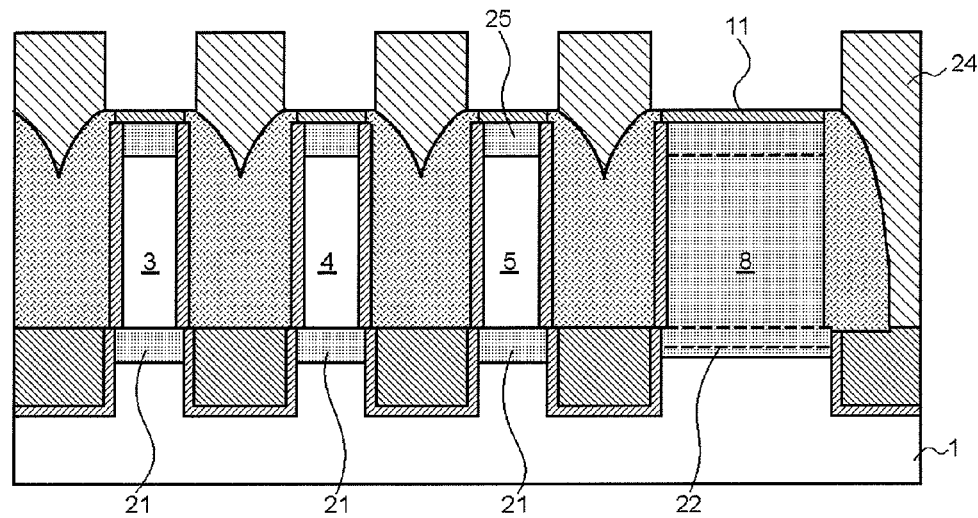
FIGS. 14A and 14B are longitudinal section views taken on line A-A and line C-C, respectively, of FIG. 14C.
Figure 14B:
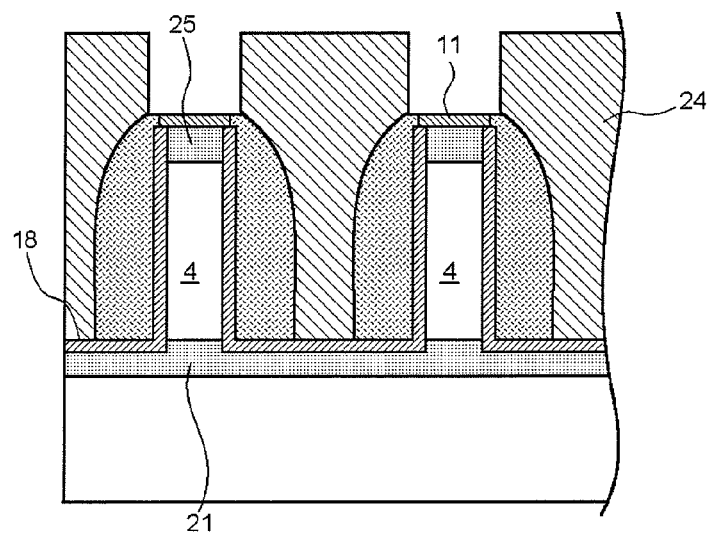
Figure 14C:
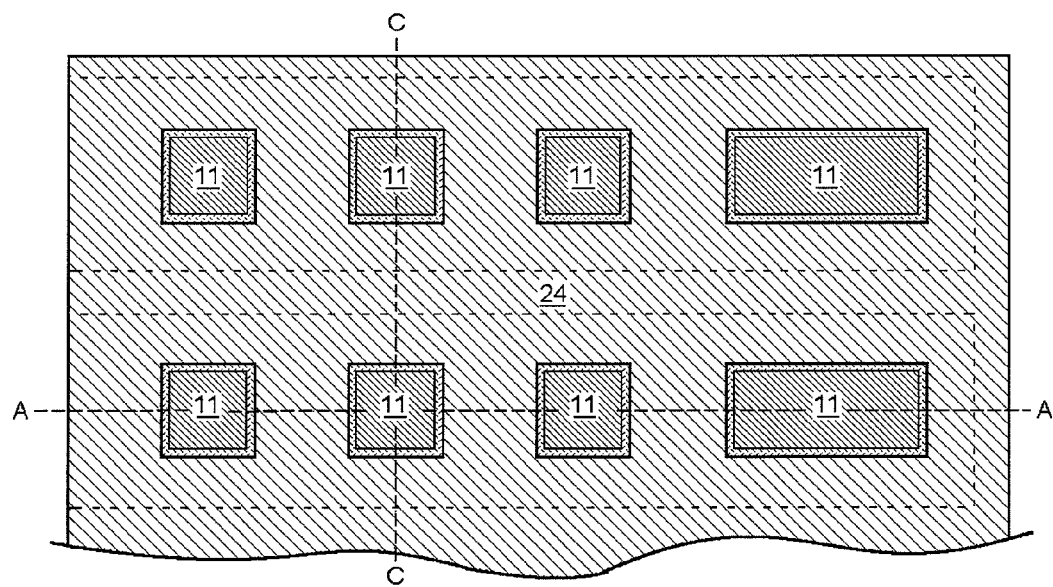
FIG. 14C is a fragmentary top view illustrating a subsequent process step in the fabrication method for the first Example.

Subsequently, as shown in the longitudinal section views in FIGS. 14A and 14B, silicon nitride film 12 remaining on top of each of silicon pillars 3, 4, 5 and 8 was removed. Thereafter, arsenic in an amount of only $5e13/cm^2$ was implanted at 20 keV, followed by a heat treatment at 1,000° C. for 10 seconds, to form upper diffusion layer 25. At that time, an upper portion of silicon pillar 8 was also implanted with arsenic, thus resulting in an increased impurity concentration in the upper portion of n-type layer 22. FIGS. 14A and 14B are longitudinal section views taken on line A-A and line C-C, respectively, of FIG. 14C.

Figure 15A:
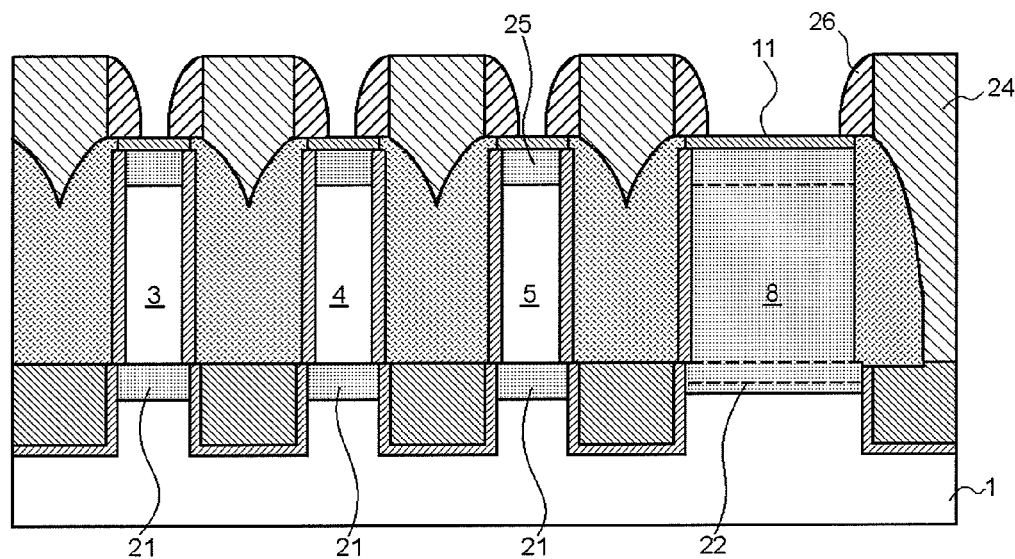
FIGS. 15A and 15B are longitudinal section views taken on line A-A and line C-C, respectively, of FIG. 15C.
Figure 15B:
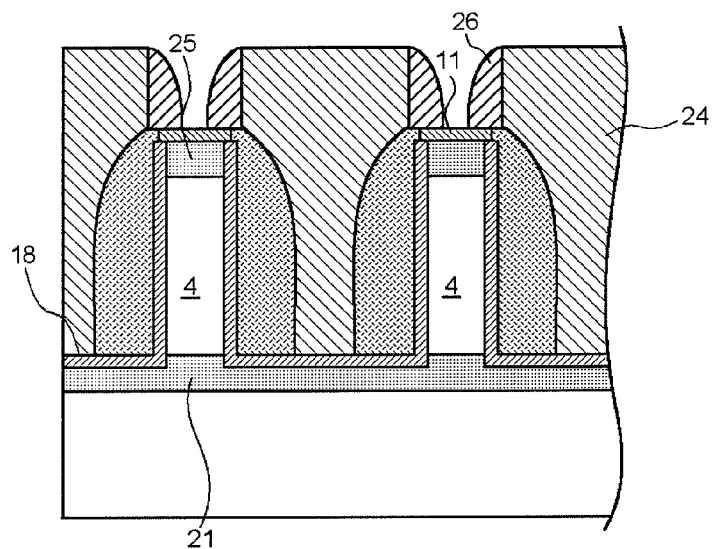
Figure 15C:
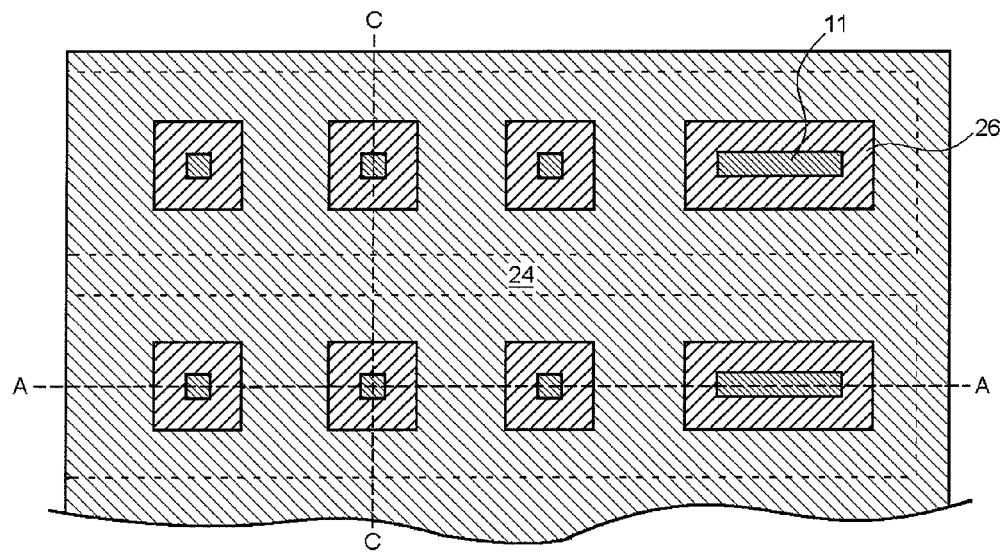
FIG. 15C is a fragmentary top view illustrating a subsequent process step in the fabrication method for the first Example.

Subsequently, as shown in the longitudinal section views in FIGS. 15A and 15B, a 10 nm-thick silicon nitride film was deposited and then etched back to form silicon nitride film sidewalls 26. FIGS. 15A and 15B are longitudinal section views taken on line A-A and line C-C, respectively, of FIG. 15C.

Figure 16A:
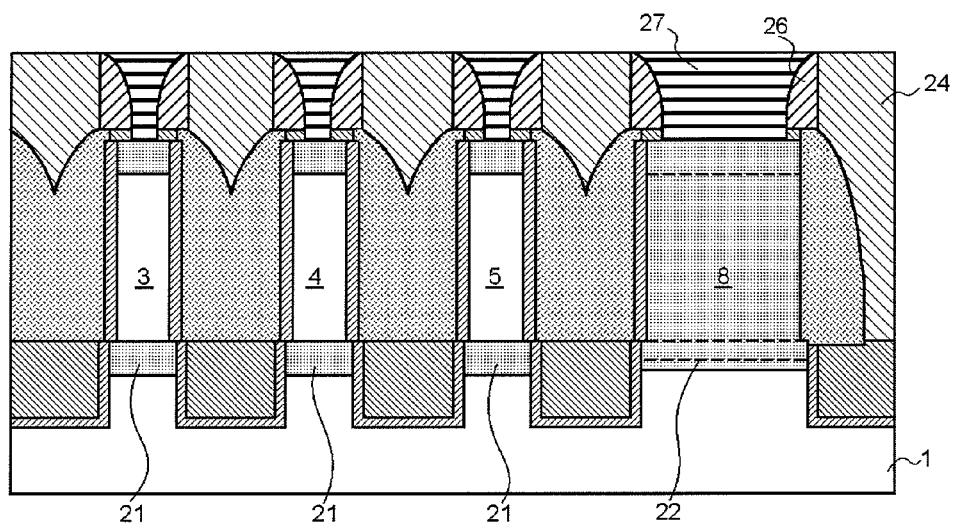
FIGS. 16A and 16B are longitudinal section views taken on line A-A and line C-C, respectively, of FIG. 16C.
Figure 16B:
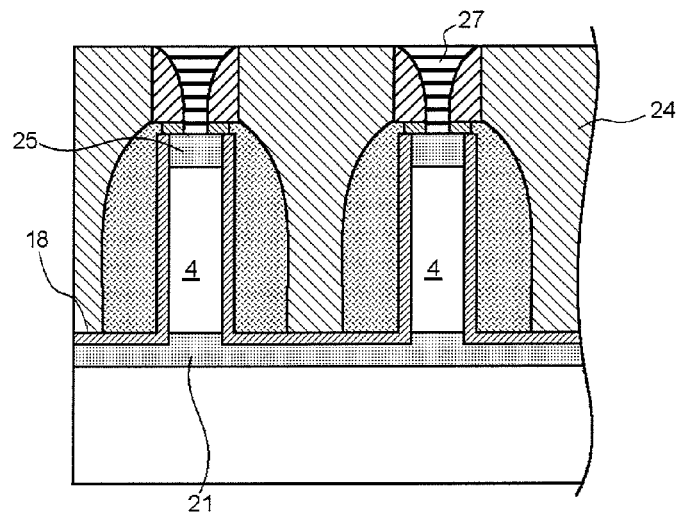
Figure 16C:
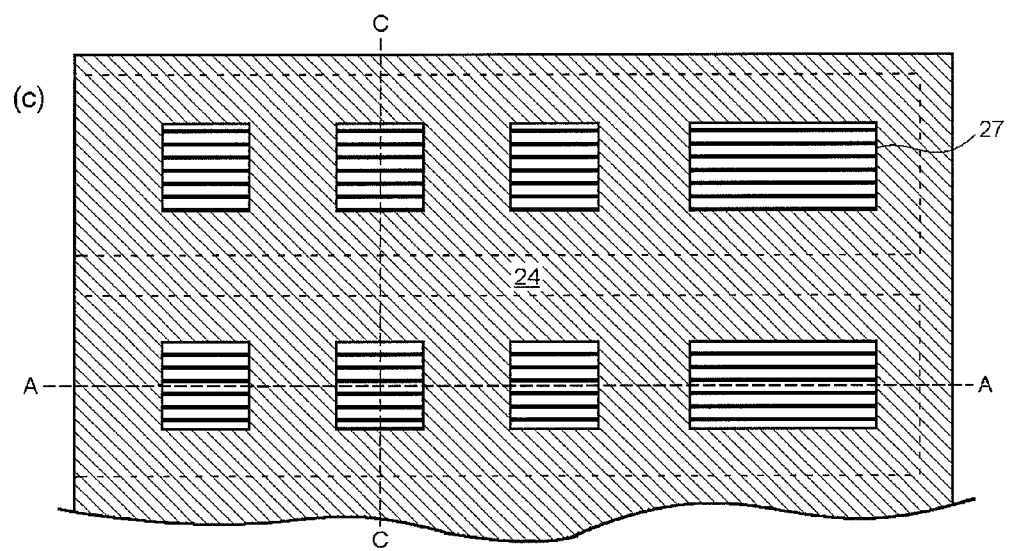
FIG. 16C is a fragmentary top view illustrating a subsequent process step in the fabrication method for the first Example.

Subsequently, as shown in the longitudinal section views in FIGS. 16A and 16B, after removal of silicon oxide film 11 remaining on top of each of silicon pillars 3, 4, 5 and 8, epitaxially grown layer 27 was formed. Epitaxially grown layer 27 was grown to a thickness of 50 nm. Thereafter, arsenic in an amount of only $1e15/cm^2$ was implanted at 30 keV, followed by a heat treatment at 1,000° C. for 10 seconds, in order to lower the resistance of epitaxially grown layer 27. FIGS. 16A and 16B are longitudinal section views taken on line A-A and line C-C, respectively, of FIG. 16C.

Finally, as shown in FIG. 1, 100 nm-thick silicon oxide film 28 was deposited and then contact holes were opened, followed by formation of electrodes 29 in the respective contact holes. In an application of the present Example to DRAM, upper diffusion layer 25 of each of vertical MOS transistors (including pillars 3, 4 and 5) is connected to a lower electrode of each of capacitors 30, while the other electrode of each capacitor 30 is to be capable of supplying plate potential 31. Epitaxially grown layer 27 on top of silicon pillar 8 is connected to word line potential supply section 6 so as to be capable of supplying a word line potential from word line potential supply section 6. Lower diffusion layers 21 are interconnected in the row direction of each of silicon pillars 3, 4 and 5 (in the vertical direction in FIG. 16C) to form a bit line under the associated transistors for supplying a bit potential through bit contacts formed in non-illustrated regions.

Advantages of First Example

According to the first Example, it is possible that: vertical MOS transistors including silicon pillars 3, 4 and 5 form DRAM cell transistors; and silicon pillar 8 is utilized to supply a word line potential. For this reason, the following advantages are provided.

When vertical MOS transistors share a gate electrode, a word line resistance is increased undesirably because polycrystalline silicon films 20 and 23 forming gate electrode 2 cannot be made thick enough. In this case, the semiconductor device cannot be expected to operate normally because the resistance of a line up to a memory mat end becomes very high. According to the word line potential supply method employed in the first Example, the provision of word line potential supply section 6 at a required place allows word line potential supply section 6 to be connected to a low-resistance word line formed thereabove. As a result, the low-resistance word line can substantially extend up to the memory mat end, thus allowing a normal operation to be performed. By providing such a word line potential supply section 6 as desired, the design freedom can be increased significantly.

SECOND EXEMPLARY EXAMPLE

Figure 17:
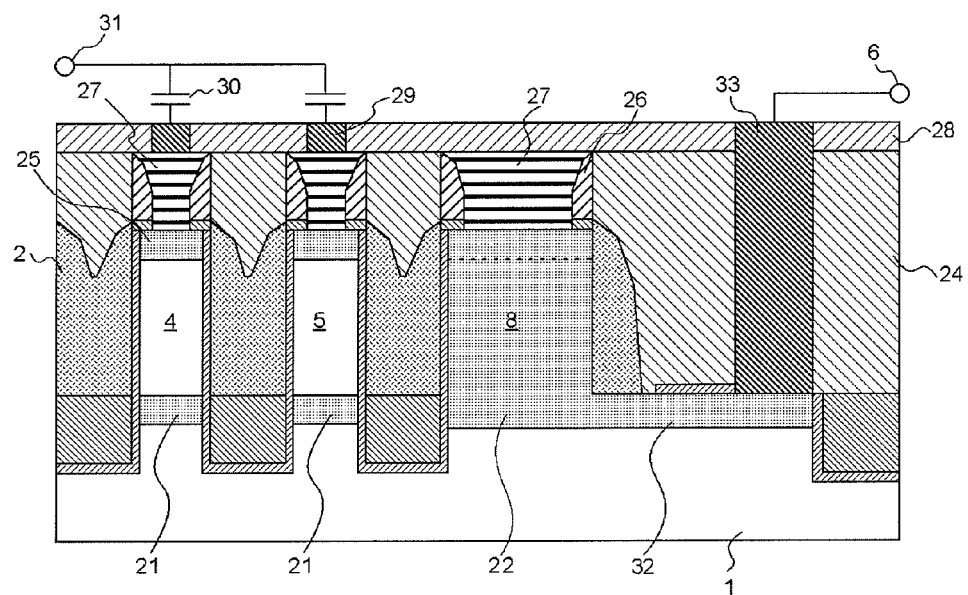
FIG. 17 is a sectional structural view illustrating a second Example.

As shown in FIG. 17, a semiconductor device according to a second Example includes: a plurality of vertical MOS transistors including first prismatic silicon pillars 4 and 5 sharing gate electrode 2 of a first conductivity type formed on a major surface of silicon substrate 1; and second pillar 8 formed simultaneously with first prismatic silicon pillars 4 and 5 forming the respective prismatic vertical MOS transistors, second pillar 8 being partially free of gate insulating film 7 and being of the first conductivity type which is the same as the conductivity type of gate electrode 2. In this structure, potential supply to gate electrode 2 shared between prismatic vertical MOS transistors is effected through a path extending from word line potential supply section 6, passing through potential supply contact 33, and reaching first conductivity type diffusion layer 32 connected to diffusion layer 22 of second pillar 8. While the structure shown in FIG. 17 has sidewall 26 and epitaxially grown layer 27 formed on silicon pillar 8 as in the first Example, there arises no problem if a structure free of sidewall 26 and epitaxially grown layer 27 is formed without removal of mask layer 12 on silicon pillar 8 and without impurity implantation to an upper portion of silicon pillar 8, or if a structure free of sidewall 26 and epitaxially grown layer 27 is formed by filling up an opening portion with an insulating film after impurity implantation to an upper portion of silicon pillar 8.

Fabrication Method for Second Example

Figure 2B:
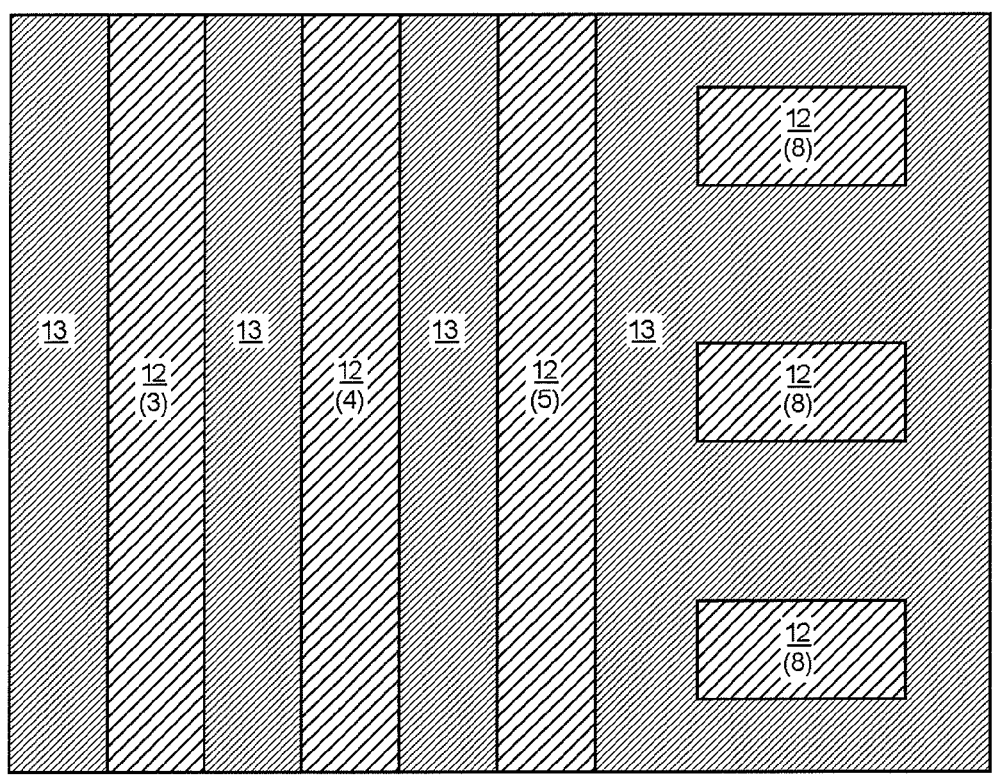
FIGS. 2B, 3B, 4B and 5B are top views corresponding to FIGS. 2A, 3A, 4A and 5A, respectively.
Figure 5A:
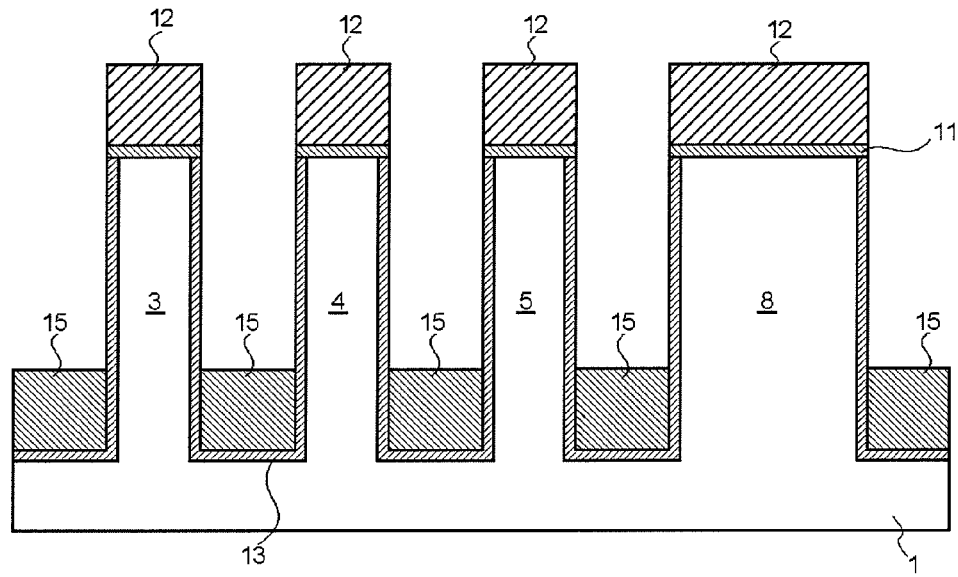
Figure 5B:
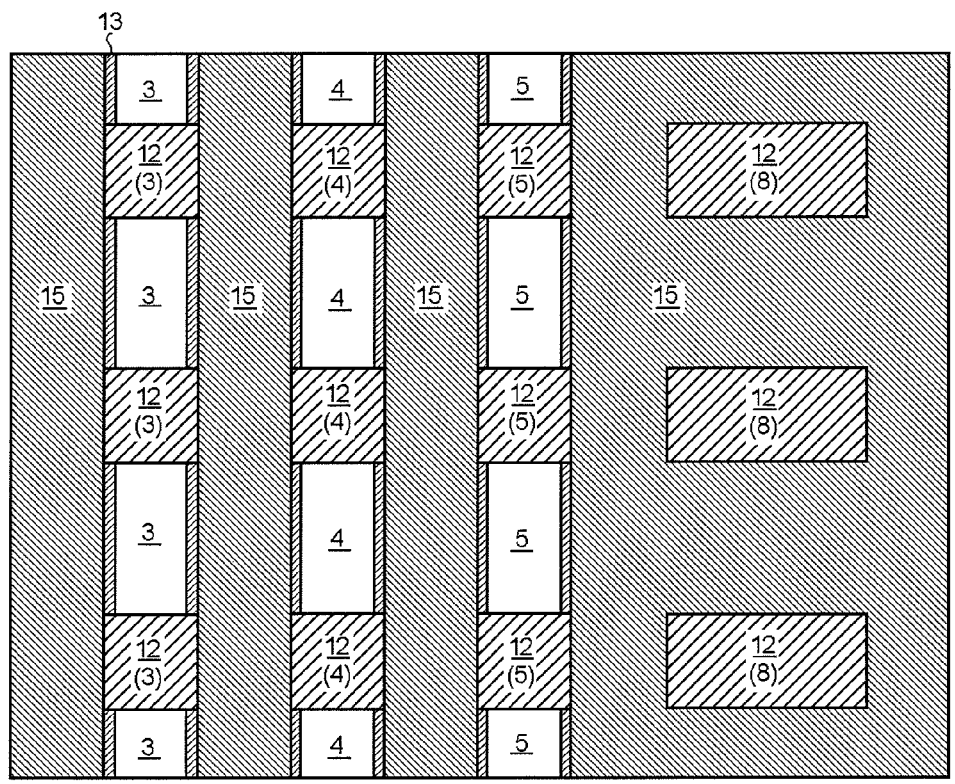
Figure 6A:
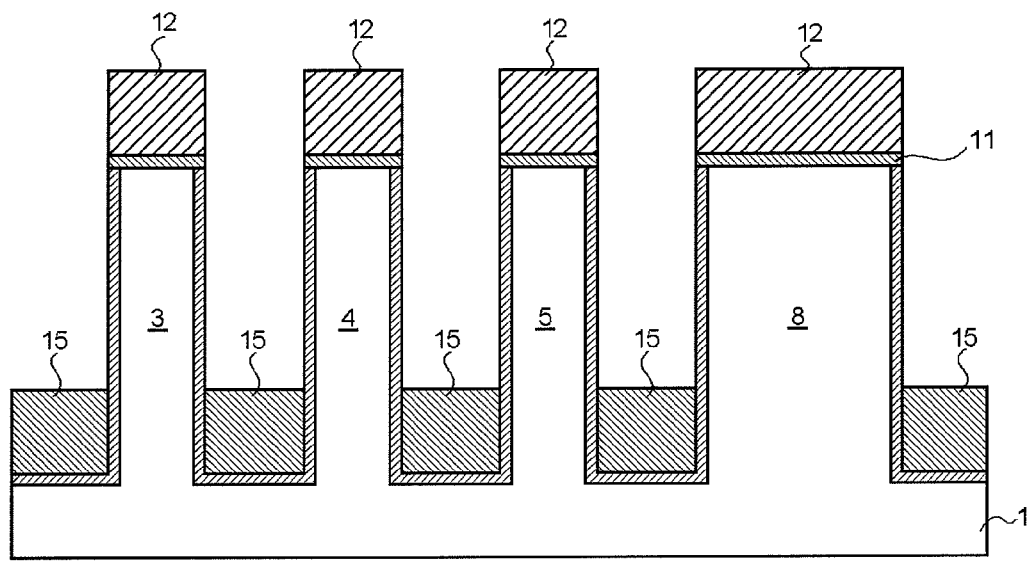
FIGS. 6A and 6B are longitudinal section views taken on line A-A and line B-B, respectively, of FIG. 6C.
Figure 6B:
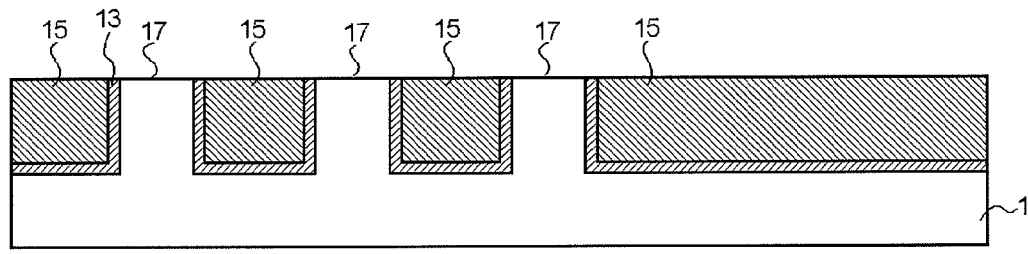
Figure 6C:
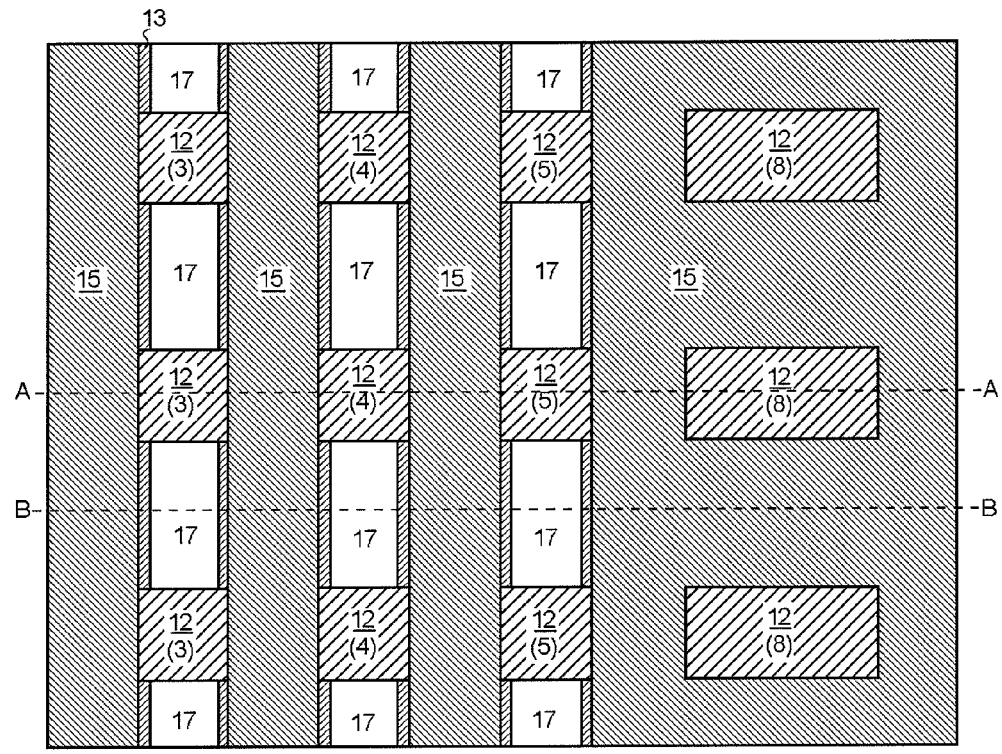
FIG. 6C is a top view illustrating a subsequent process step in the fabrication method for the first Example.
Figure 18A:
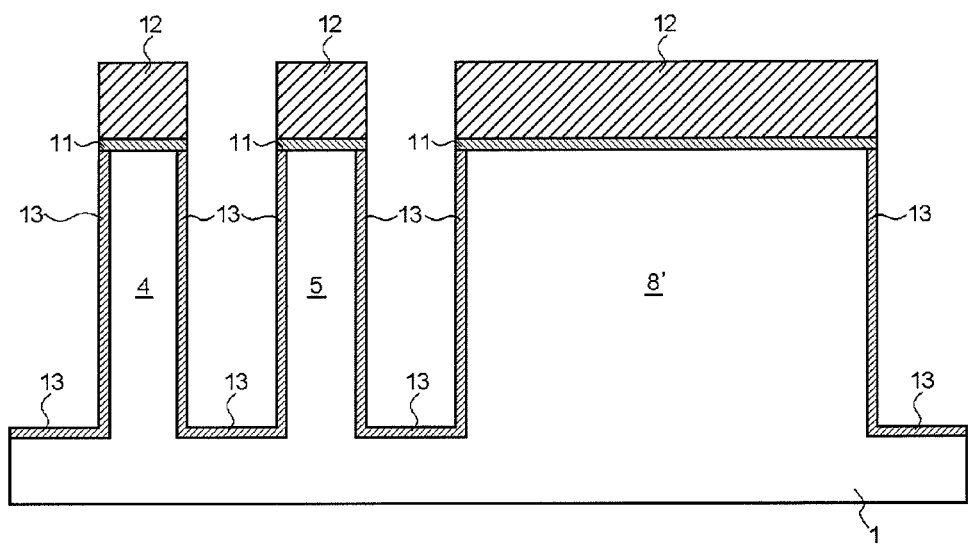
FIGS. 18A, 19A and 20A are longitudinal section views illustrating process steps in a fabrication method for the second Example.
Figure 18B:
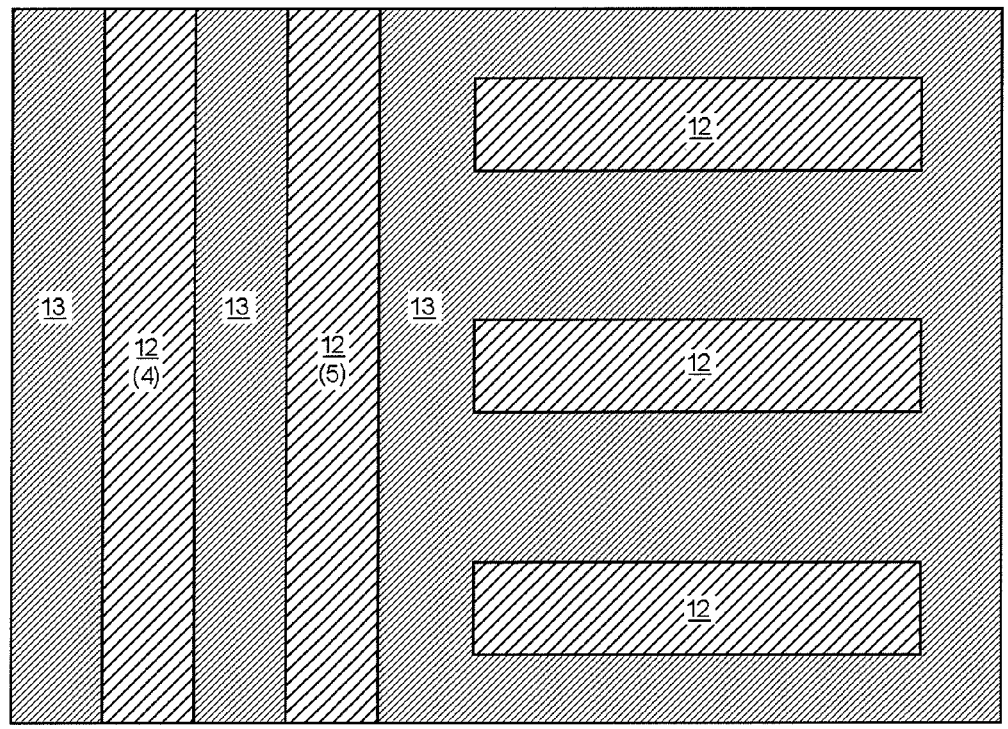
FIGS. 18B, 19B and 20B are top views corresponding to FIGS. 18A, 19A and 20A, respectively.
Figure 19A:
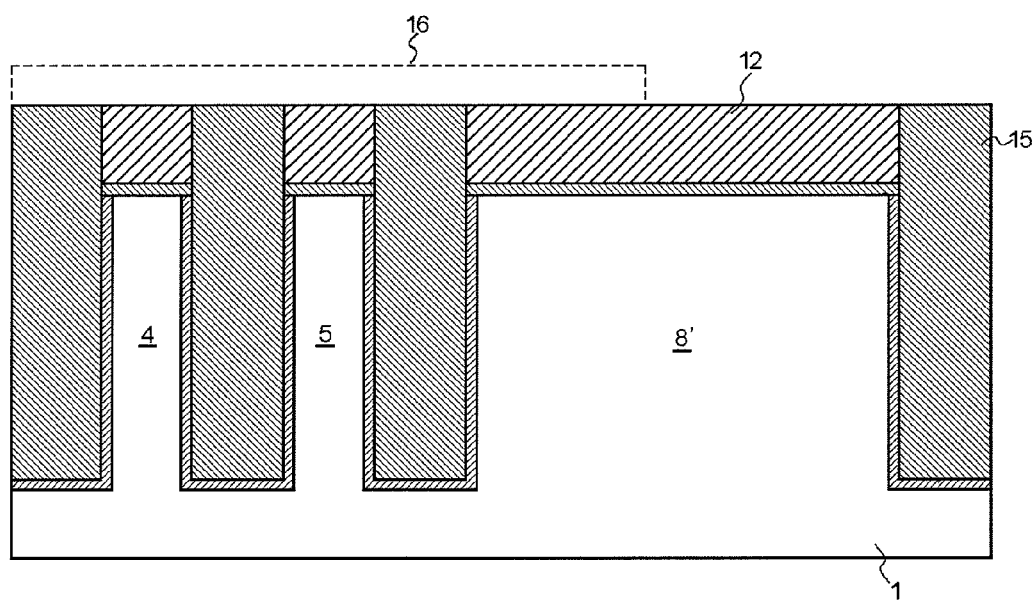
Figure 19B:
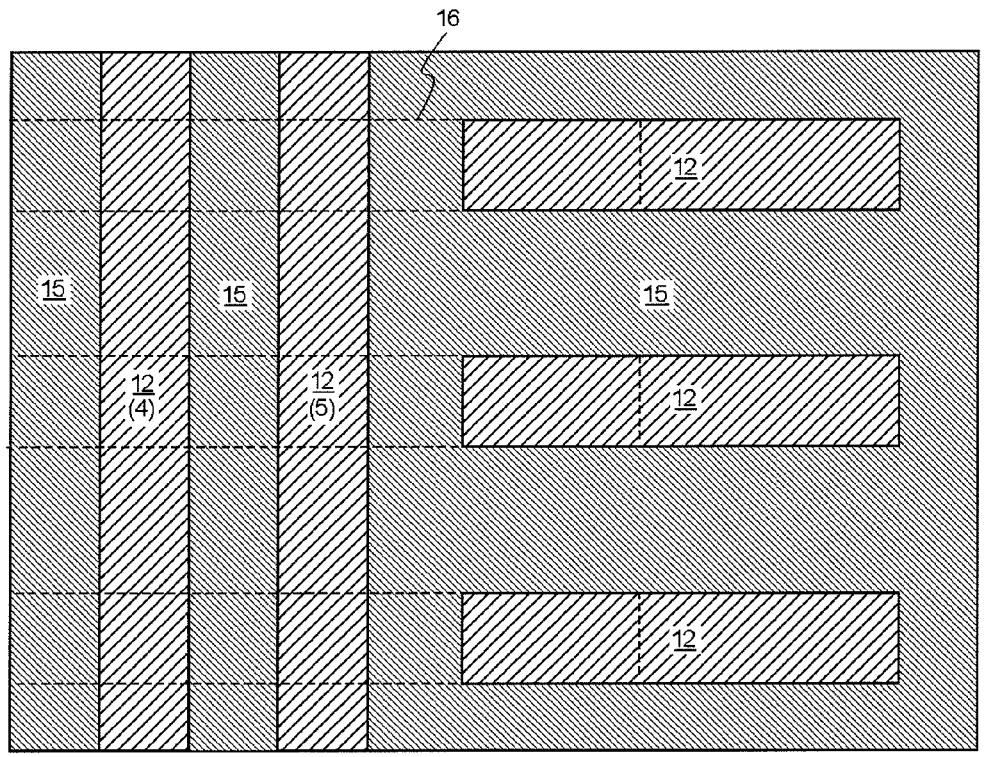
Figure 20A:
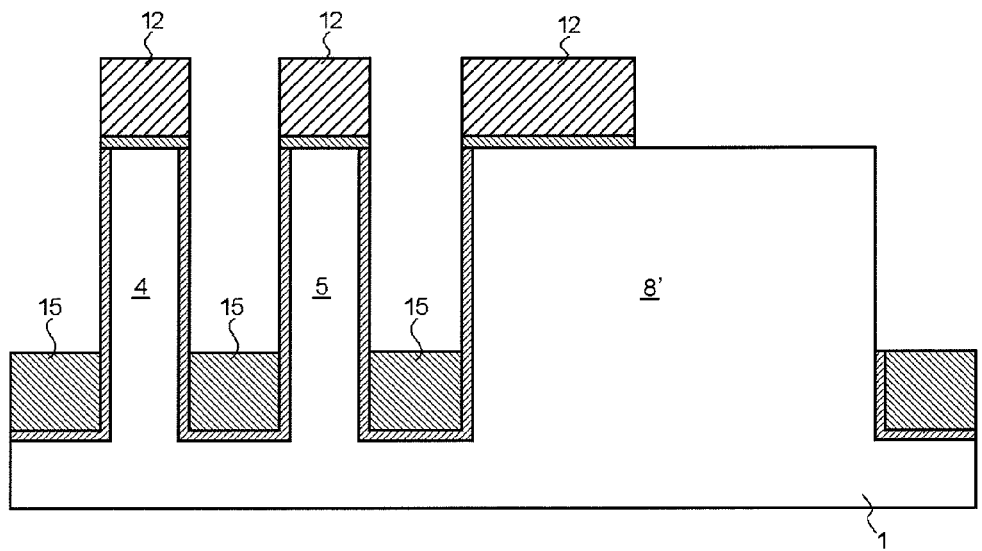
Figure 20B:
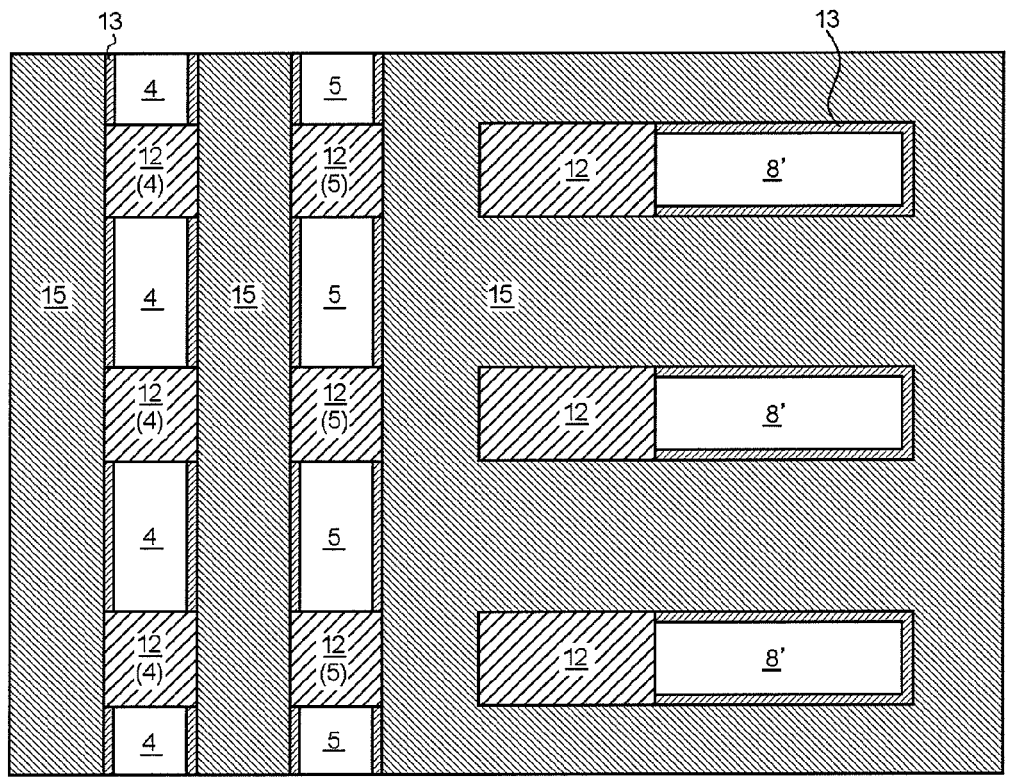
Figure 21A:
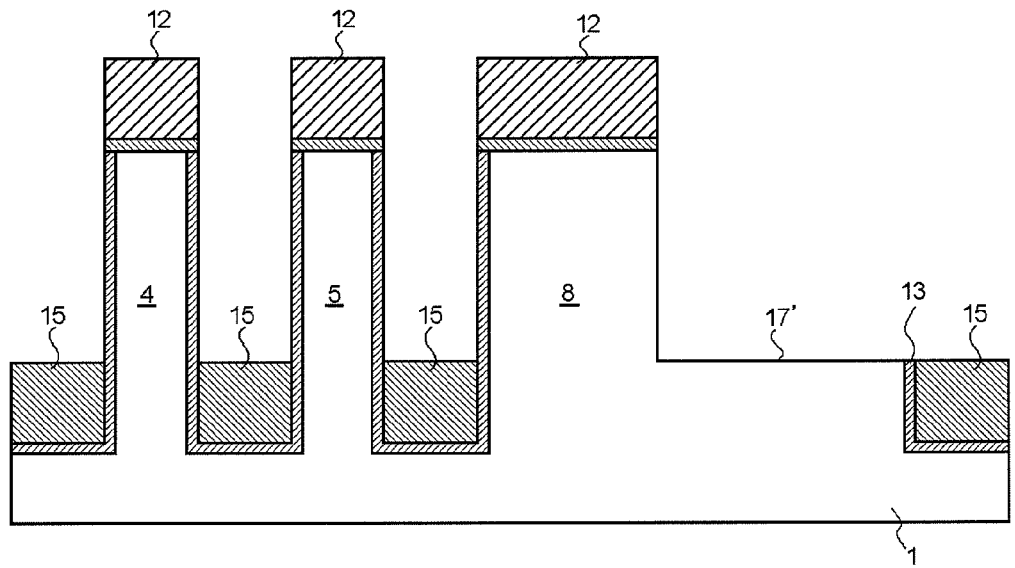
FIGS. 21A and 21B are longitudinal section views taken on line A-A and line B-B, respectively, of FIG. 21C.
Figure 21B:
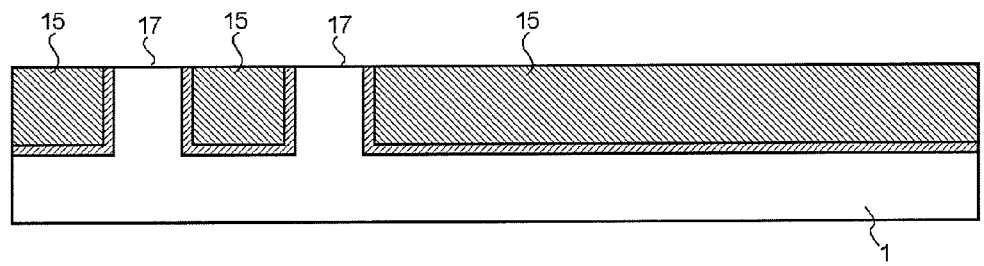
Figure 21C:
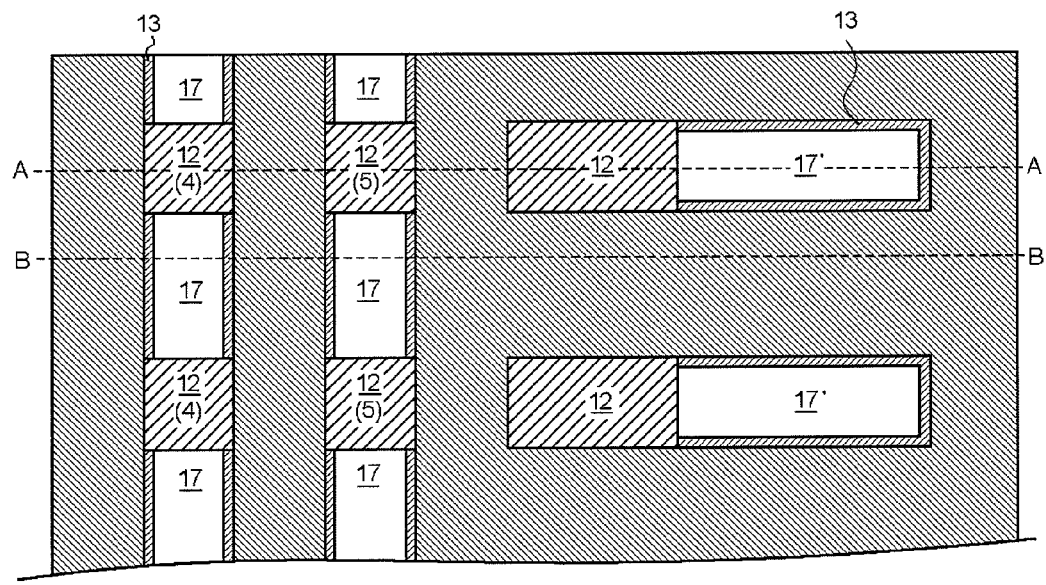
FIG. 21C is a top view illustrating a subsequent process step in the fabrication method for the second Example.

A fabrication method for the second Example, which is substantially the same as the fabrication method for the first Example, can be realized by: replacing the structure shown in FIGS. 2A and 2B with a structure shown in FIGS. 18A and 18B; replacing the structure shown in FIGS. 4A and 4B with a structure shown in FIGS. 19A and 19B; replacing the structure shown in FIGS. 5A and 5B with a structure shown in FIGS. 20A to 20C; and replacing the structure shown in FIGS. 6A to 6C with a structure shown in FIGS. 21A to 21C.

Specifically, silicon pillar 8 (i.e., silicon pillar 8') was formed so as to be laterally longer than that of the first Example as shown in FIGS. 18A and 18B, and subsequently, resist mask 16 was formed so as to partially expose silicon nitride film 12 on silicon pillar 8' as shown in FIGS. 19A and 19B. Subsequently, as shown in FIGS. 20A to 20C, silicon pillars 4, 5 and 8' exposed in regions free of silicon nitride film 12 were subjected to etching. Here, the amount of silicon etched was 100 nm. FIGS. 20A and 20B are longitudinal section views taken on line A-A and line B-B, respectively, of FIG. 20C. Thus, silicon surfaces 17 and 17' were exposed at substantially the same height as silicon oxide film 15. Thereafter, the process proceeded in the same manner as in the first Example until the formation of silicon oxide film 28. Subsequently, contact holes were opened and then electrodes 29 and contact 33 were formed.

Advantages of Second Example

The second Example has advantages similar to those of the first Example. The degree of freedom to position contact 33 is increased, through the area required for potential supply to the gate electrode is increased.

THIRD EXEMPLARY EXAMPLE

Figure 22:
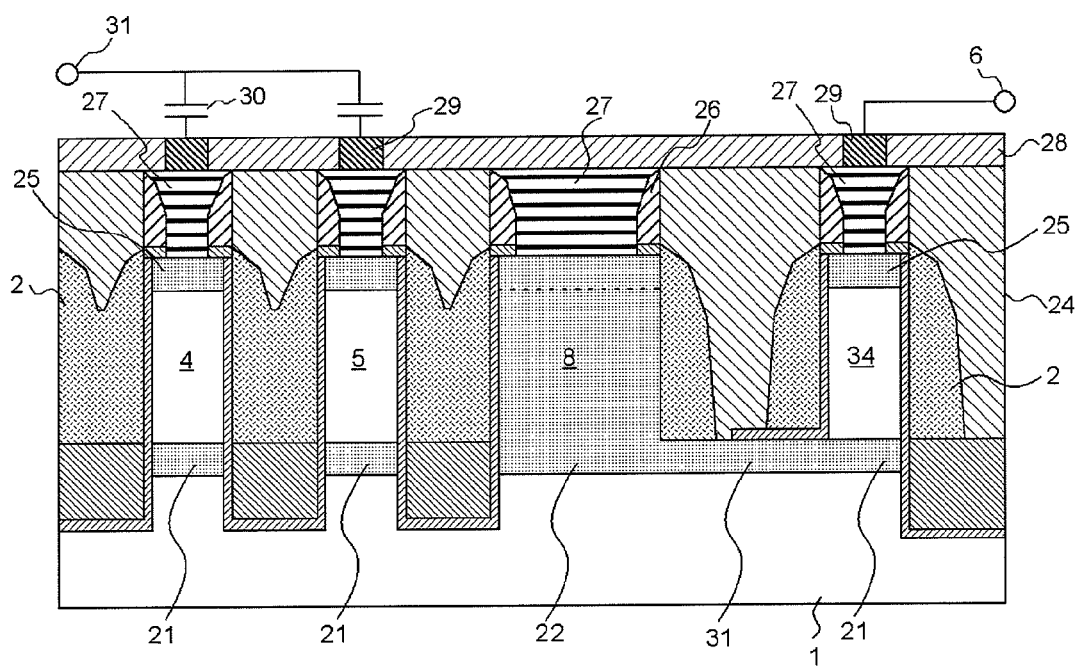
FIG. 22 is a sectional structural view illustrating a third Example.

As shown in FIG. 22, a semiconductor device according to a third Example has a structure including: a plurality of prismatic vertical MOS transistors (including first prismatic pillars 4 and 5) sharing a gate electrode of a first conductivity type; second pillar 8 formed simultaneously with first prismatic pillars 4 and 5 forming the respective prismatic vertical MOS transistors, second pillar 8 being free of a gate insulating film at least partially and being of the first conductivity type which is the same as the conductivity type of the gate electrode; and vertical MOS transistor 34 sharing diffusion layer 31 with second pillar 8. In this structure, potential supply to gate electrode 2 shared between prismatic vertical MOS transistors including first pillars 4 and 5 is effected by driving vertical MOS transistor 34 sharing diffusion layer 31 of the first conductivity type with second pillar 8.

Fabrication Method for Third Example

A fabrication method for the third Example is a combination of the fabrication method for the first Example and the fabrication method for the second Example. For this reason, detailed description thereof will be omitted.

Advantages of Third Example

The third Example has advantages similar to those of the first Example. Since potential supply from upper diffusion layer 25 of vertical MOS transistor 34 becomes possible, the layout freedom is increased, though an additional area is required for the provision of vertical MOS transistor 34 needed for the potential supply to gate electrode 2 shared between the plurality of prismatic vertical MOS transistors 4 and 5.

It is apparent that the present invention is not limited to the above embodiments, but may be modified and changed without departing from the scope and spirit of the invention.

What is claimed is:

1. A semiconductor device comprising:
a plurality of vertical MOS transistors sharing a gate electrode of a first conductivity type, wherein said plurality of vertical MOS transistors comprises first semiconductor pillars with a first gate insulating film formed around lateral sides of the first semiconductor pillars, and the lateral sides of the first semiconductor pillars facing said gate electrode via said first gate insulating film; and
a second semiconductor pillar being of the first conductivity type with a second gate insulating film formed around lateral sides of the second semiconductor pillar, and being in contact with said gate electrode at a portion thereof from which at least a part of said second gate insulating film is removed, wherein potential supply to said gate electrode shared between said plurality of vertical MOS transistors is effected through said second semiconductor pillar.

2. The semiconductor device according to claim 1, wherein the potential supply to said gate electrode shared between said plurality of vertical MOS transistors is effected through an electrode/interconnection contacted on the top of said second semiconductor pillar.

3. The semiconductor device according to claim 1, wherein the potential supply to said gate electrode shared between said plurality of vertical MOS transistors is effected through an electrode/interconnection contacted with a diffusion layer of the first conductivity type formed at the bottom of said second semiconductor pillar.

4. The semiconductor device according to claim 1, wherein the potential supply to said gate electrode shared between said plurality of vertical MOS transistors is effected by driving a separate vertical MOS transistor which shares with said second semiconductor pillar a diffusion layer of the first conductivity type formed at the bottom of said second semiconductor pillar.

5. The semiconductor device according to claim 1, which includes an arrayed configuration wherein: a plurality of transistor columns is disposed each including said plurality of vertical MOS transistors sharing a gate electrode of the first conductivity type; and transistors in a row each belonging to a respective one of the transistor columns are interconnected through a diffusion layer of the first conductivity type formed under each of the first semiconductor pillars in a row direction of each of the first semiconductor pillars intersecting the transistor columns, to form a bit line extending under the transistors in the row direction.

6. The semiconductor device according to claim 2, which includes an arrayed configuration wherein: a plurality of transistor columns are disposed each including a plurality of vertical MOS transistors sharing a gate electrode of the first conductivity type; transistors in a row each belonging to a respective one of the transistor columns are interconnected through a diffusion layer of the first conductivity type formed under each of the first semiconductor pillars in a row direction of each of the first semiconductor pillars intersecting the transistor columns, to form a bit line extending under the transistors in the row direction.

7. The semiconductor device according to claim 3, which includes an arrayed configuration wherein: a plurality of transistor columns are disposed each including a plurality of vertical MOS transistors sharing a gate electrode of the first conductivity type; transistors in a row each belonging to a respective one of the transistor columns are interconnected through a diffusion layer of the first conductivity type formed under each of the first semiconductor pillars in a row direction of each of the first semiconductor pillars intersecting the transistor columns, to form a bit line extending under the transistors in the row direction.

8. The semiconductor device according to claim 4, which includes an arrayed configuration wherein: a plurality of transistor columns are disposed each including a plurality of vertical MOS transistors sharing a gate electrode of the first conductivity type; transistors in a row each belonging to a respective one of the transistor columns are interconnected through a diffusion layer of the first conductivity type formed under each of the first semiconductor pillars in a row direction of each of the first semiconductor pillars intersecting the transistor columns, to form a bit line extending under the transistors in the row direction.

* * * * *